(12) United States Patent
Kamineni et al.

(10) Patent No.: US 10,446,443 B2
(45) Date of Patent: Oct. 15, 2019

(54) INTEGRATED CIRCUIT PRODUCT HAVING A THROUGH-SUBSTRATE-VIA (TSV) AND A METALLIZATION LAYER THAT ARE FORMED AFTER FORMATION OF A SEMICONDUCTOR DEVICE

(71) Applicant: GLOBALFOUNDRIES Inc., Grand Cayman (KY)

(72) Inventors: Himani Suhag Kamineni, Mechanicville, NY (US); Vimal Kumar Kamineni, Mechanicville, NY (US); Daniel Smith, Ballston Spa, NY (US); Maxwell Lippitt, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/877,549

(22) Filed: Jan. 23, 2018

(65) Prior Publication Data
US 2018/0158733 A1 Jun. 7, 2018

Related U.S. Application Data

(63) Continuation of application No. 15/228,317, filed on Aug. 4, 2016, now Pat. No. 9,917,009.

(51) Int. Cl.
*H01L 29/66* (2006.01)
*H01L 21/768* (2006.01)
(Continued)

(52) U.S. Cl.
CPC .. *H01L 21/76898* (2013.01); *H01L 21/30625* (2013.01); *H01L 21/76816* (2013.01);
(Continued)

(58) Field of Classification Search
CPC ..... H01L 29/66; H01L 29/417; H01L 29/423; H01L 23/522; H01L 23/532; H01L 23/53228; H01L 23/53295; H01L 23/5226; H01L 23/528; H01L 23/538; H01L 23/485; H01L 23/53214; H01L 23/53257; H01L 23/53209; H01L 23/53223; H01L 23/53252; H01L 23/53266;
(Continued)

(56) References Cited

U.S. PATENT DOCUMENTS 8,631,570 B2  1/2014  Lindgren et al.
9,093,503 B1  7/2015  Chen et al.
(Continued)

*Primary Examiner* — Chuong A Luu
(74) *Attorney, Agent, or Firm* — Amerson Law Firm, PLLC

(57) ABSTRACT

An integrated circuit product includes a substrate, an interlayer dielectric (ILD) material positioned above the substrate and a through-substrate-via (TSV) extending continuously through the substrate and the ILD material. The TSV includes a substrate portion of the TSV that is positioned in and extends continuously through the substrate and an ILD portion of the TSV that is positioned in and extends continuously through the ILD. An insulating liner layer is selectively positioned between and separates the substrate portion of the TSV and the substrate, wherein the selectively positioned insulating liner layer does not extend from the substrate to the ILD material.

20 Claims, 31 Drawing Sheets

(51) Int. Cl.
  *H01L 21/306* (2006.01)
  *H01L 23/532* (2006.01)
  *H01L 29/423* (2006.01)
  *H01L 29/417* (2006.01)
  *H01L 23/485* (2006.01)
  *H01L 23/522* (2006.01)
(52) U.S. Cl.
  CPC ...... *H01L 23/485* (2013.01); *H01L 23/53214* (2013.01); *H01L 23/53228* (2013.01); *H01L 23/53257* (2013.01); *H01L 29/41741* (2013.01); *H01L 29/4232* (2013.01); *H01L 29/66666* (2013.01); *H01L 23/5226* (2013.01); *H01L 23/53209* (2013.01); *H01L 23/53223* (2013.01); *H01L 23/53238* (2013.01); *H01L 23/53252* (2013.01); *H01L 23/53266* (2013.01); *H01L 23/53295* (2013.01)
(58) Field of Classification Search
  CPC ........... H01L 29/66666; H01L 29/4232; H01L 29/41741; H01L 21/786; H01L 21/76898; H01L 21/76802; H01L 21/76807; H01L 21/76841; H01L 21/76816; H01L 21/30625
  USPC .................................. 438/667; 257/774, 775
  See application file for complete search history.

(56) References Cited

U.S. PATENT DOCUMENTS

| | | | |
|---|---|---|---|
| 2008/0113505 A1* | 5/2008 | Sparks | H01L 21/76898 438/637 |
| 2009/0191708 A1 | 7/2009 | Kropewnicki et al. | |
| 2010/0032764 A1* | 2/2010 | Andry | H01L 21/76898 257/369 |
| 2011/0298083 A1 | 12/2011 | Yoneda | |
| 2013/0001783 A1* | 1/2013 | Yu | H01L 21/76847 257/751 |
| 2013/0249045 A1* | 9/2013 | Kang | H01L 23/481 257/499 |
| 2013/0320531 A1 | 12/2013 | Chen et al. | |
| 2014/0138848 A1 | 5/2014 | Matsuura | |
| 2015/0364400 A1 | 12/2015 | Dando | |
| 2016/0035722 A1 | 2/2016 | Or-Bach et al. | |
| 2016/0056090 A1* | 2/2016 | Yang | H01L 21/76898 257/774 |

* cited by examiner

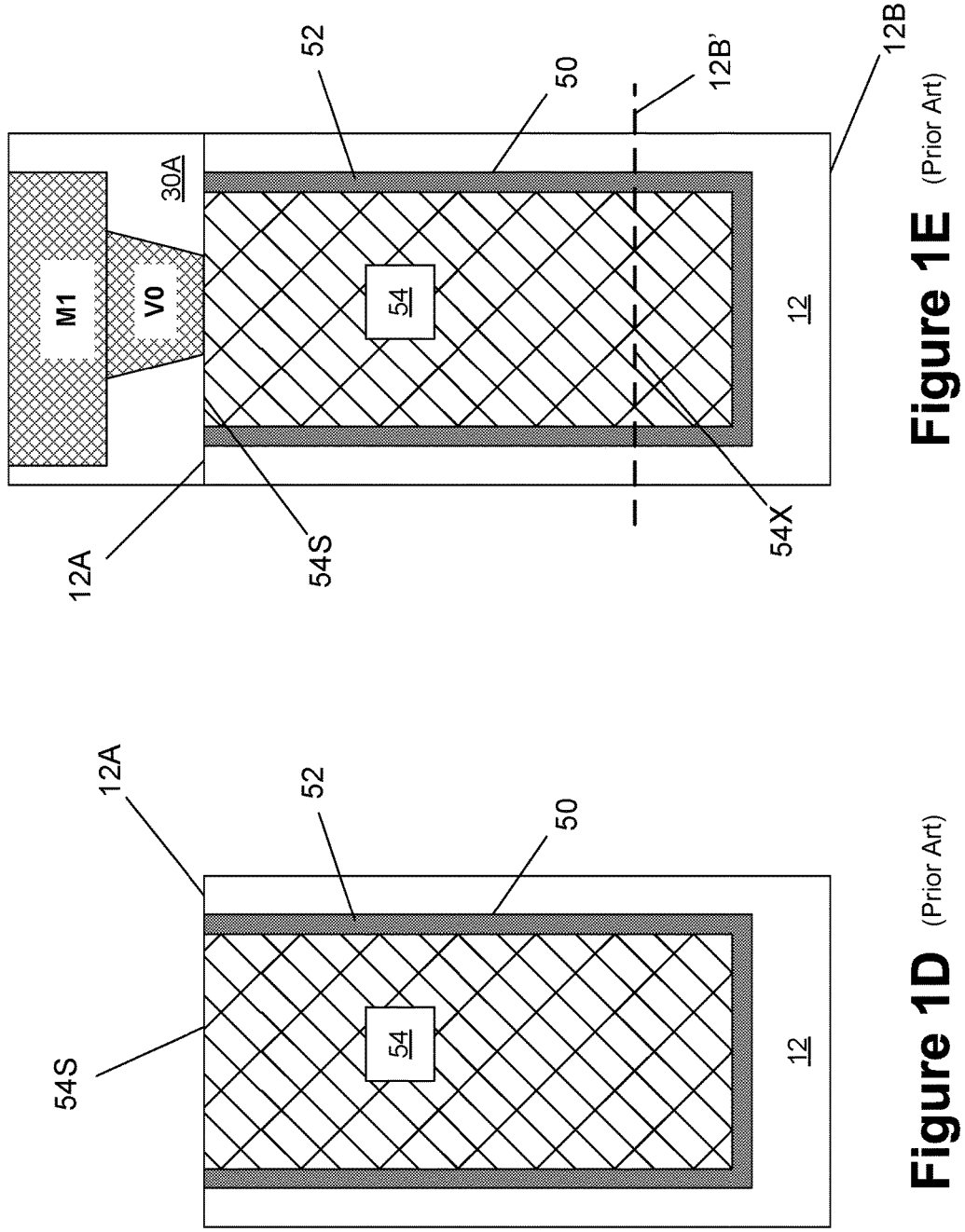

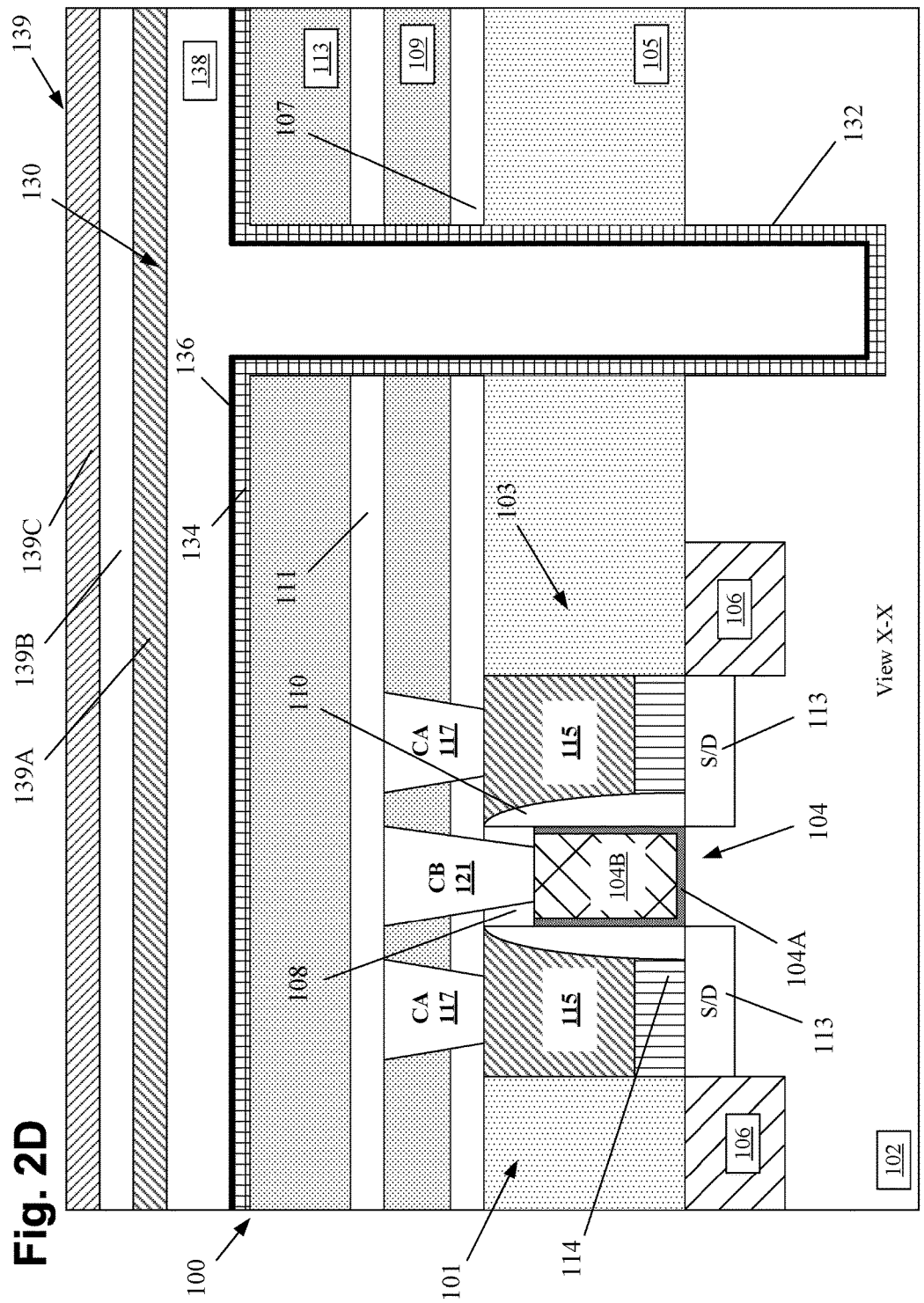

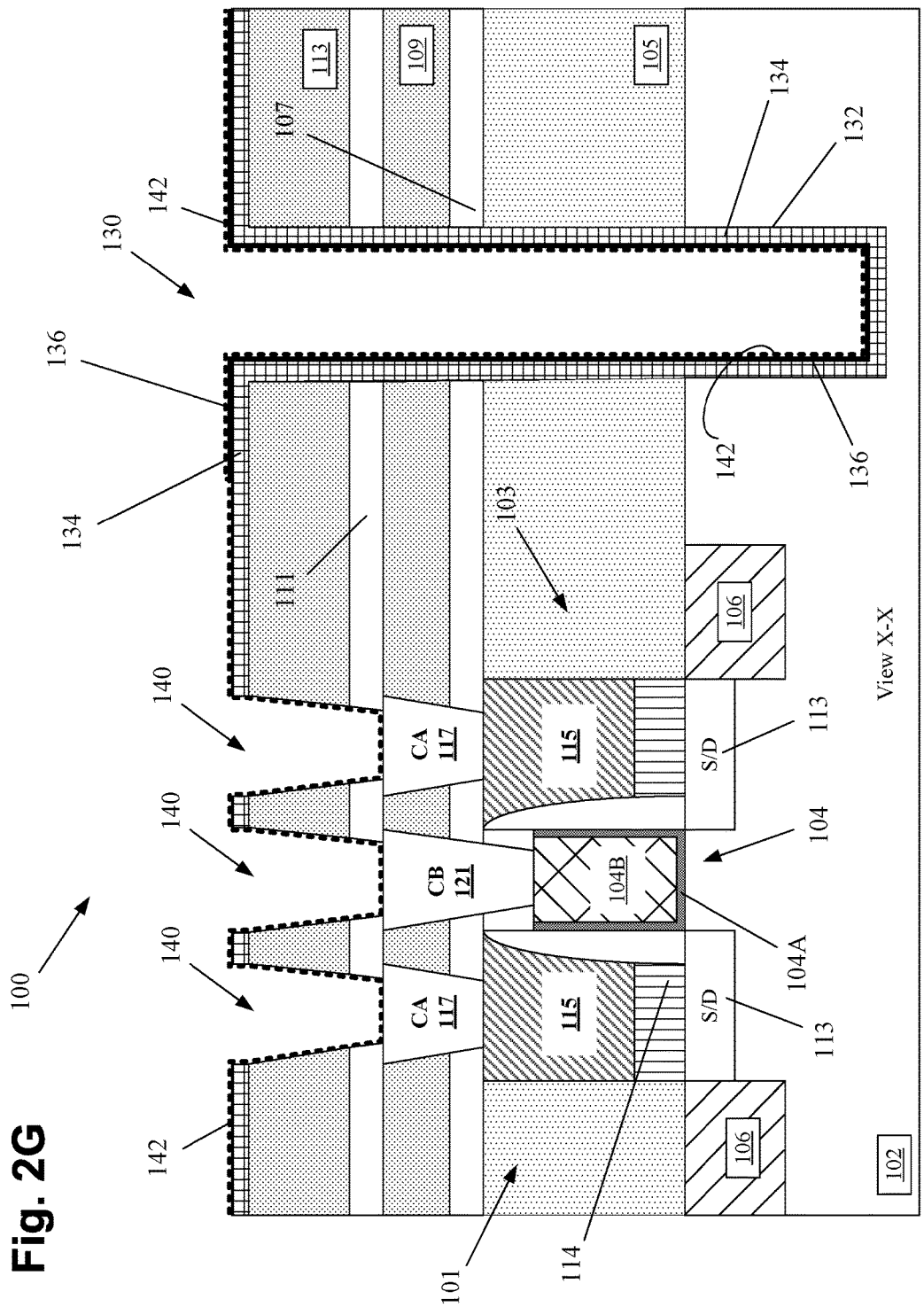

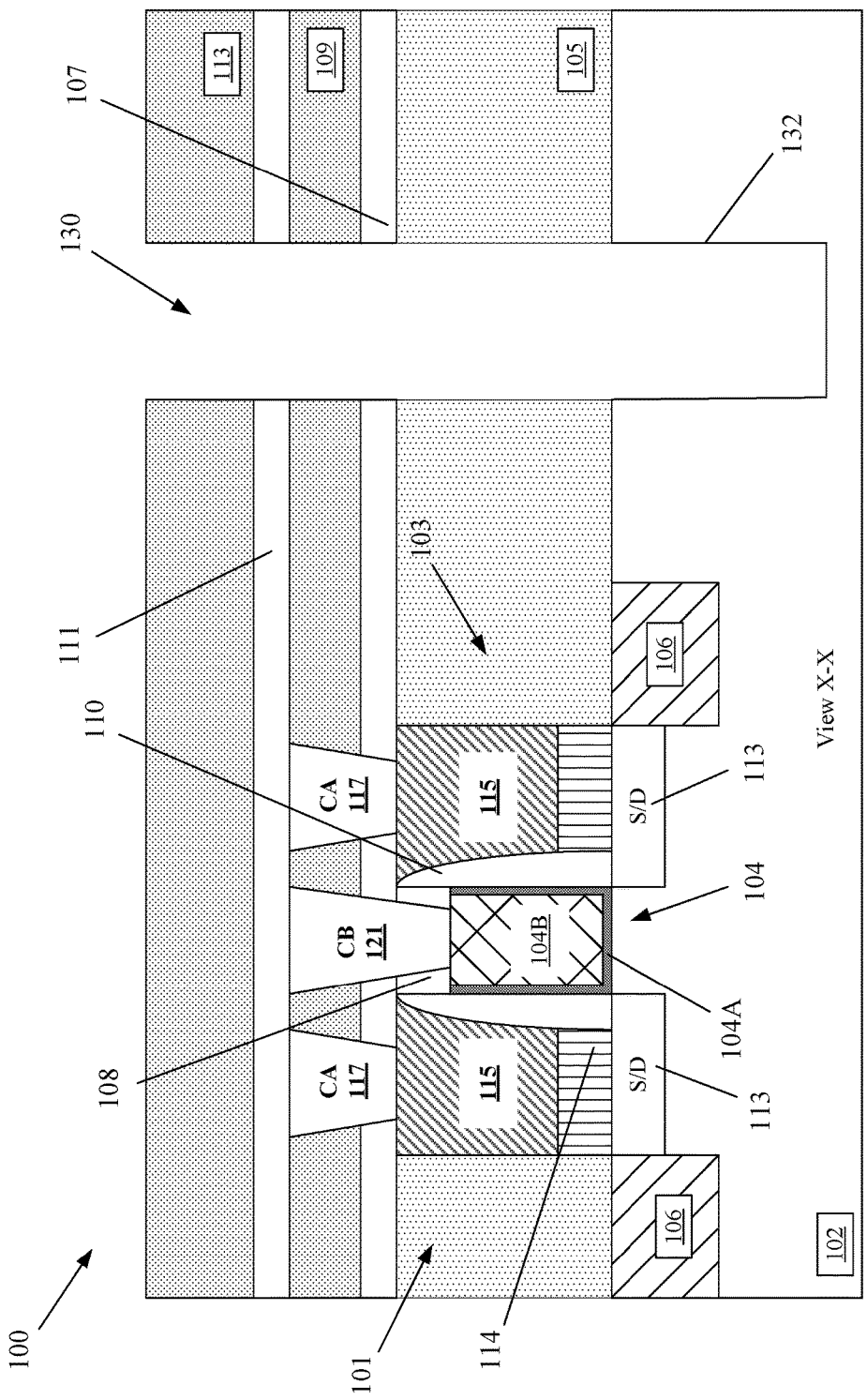

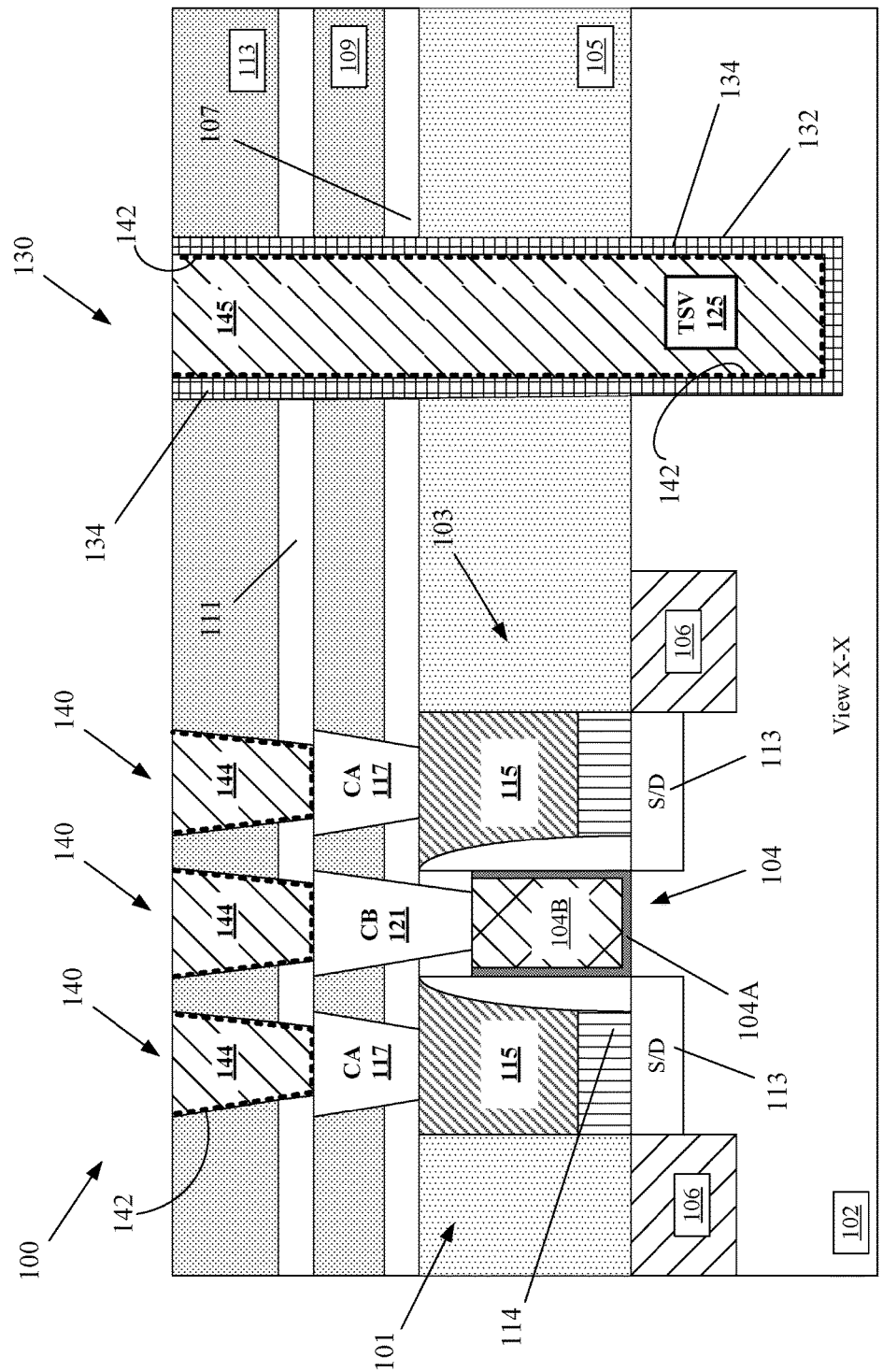

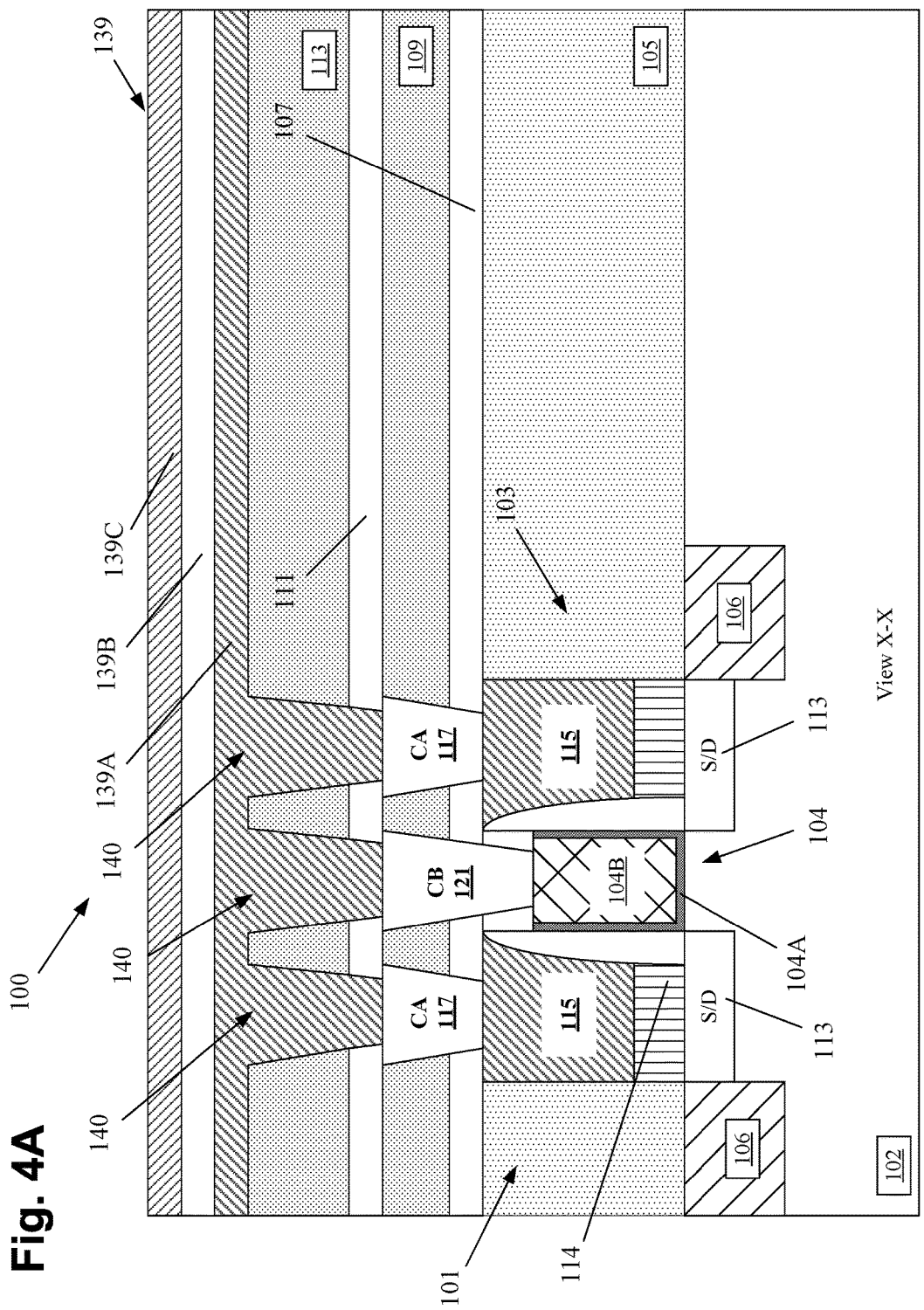

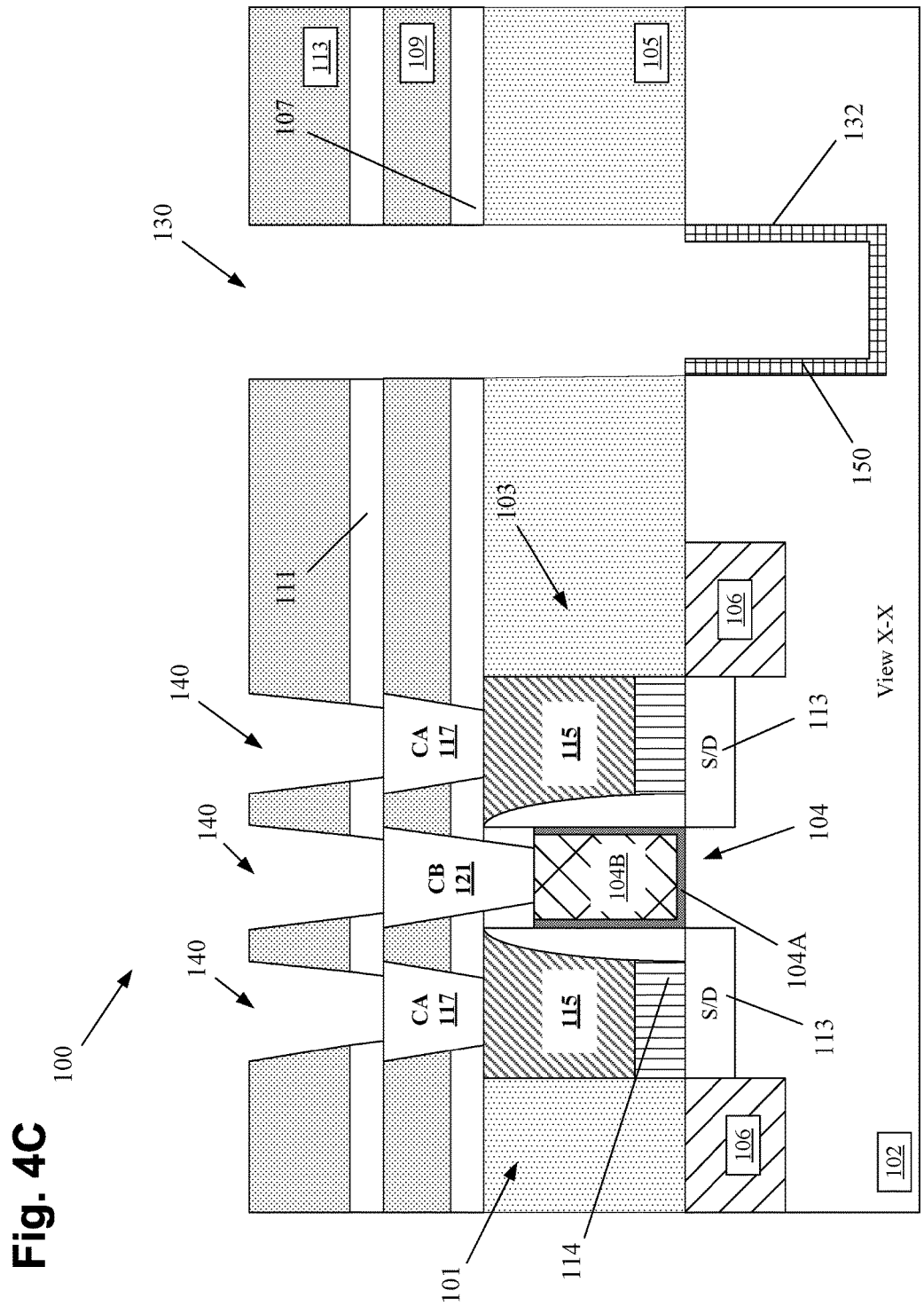

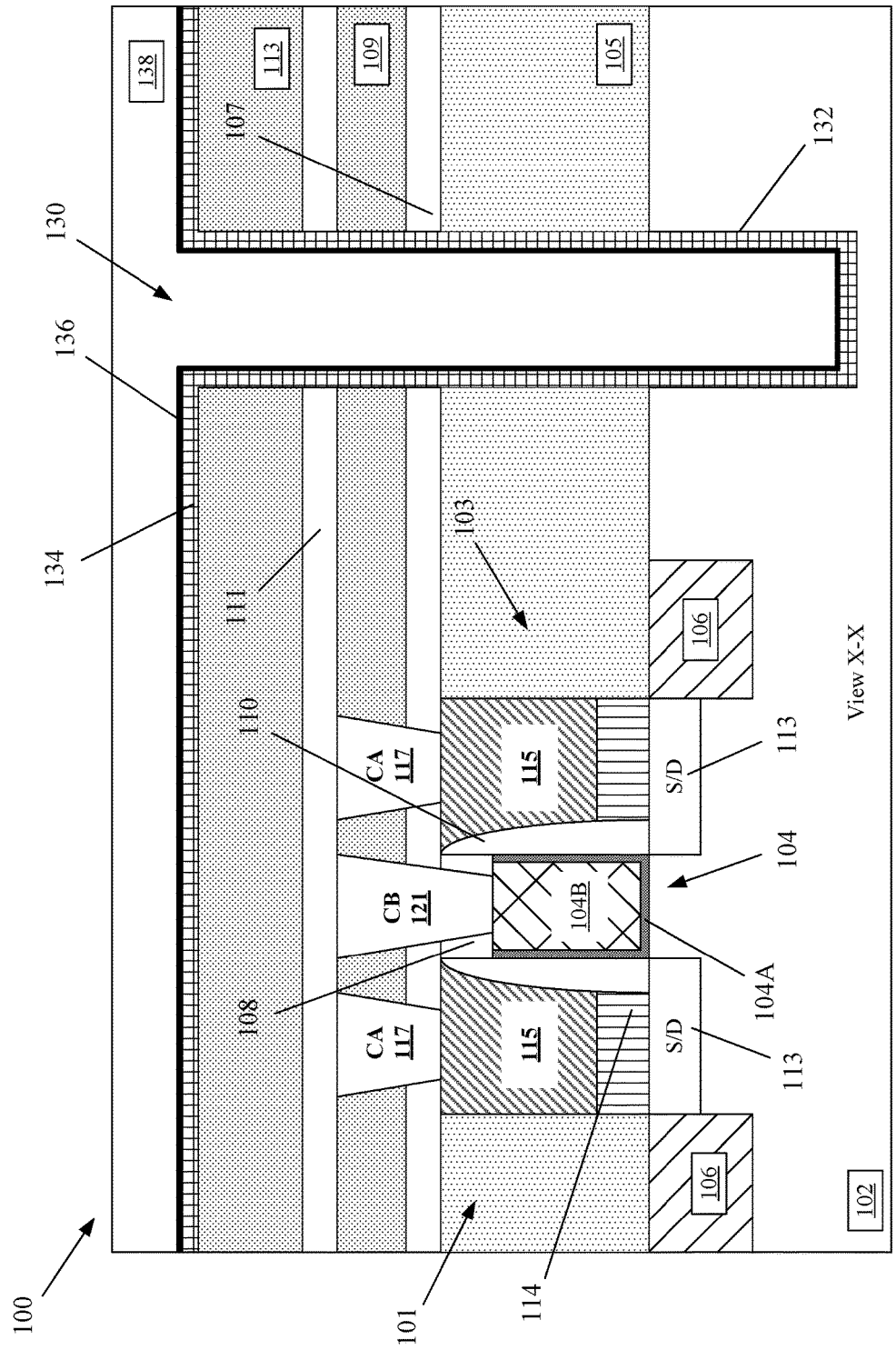

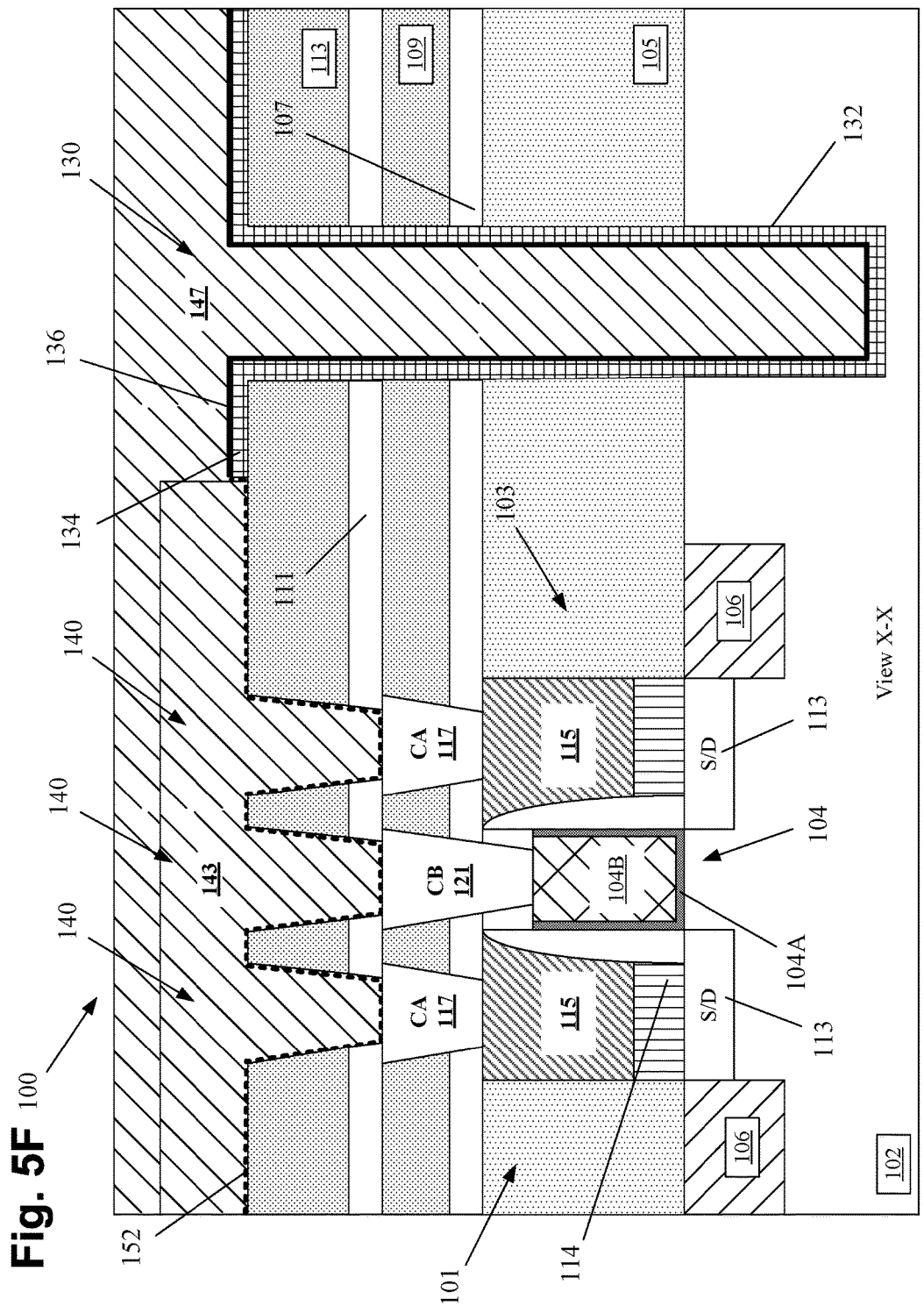

INTEGRATED CIRCUIT PRODUCT HAVING A THROUGH-SUBSTRATE-VIA (TSV) AND A METALLIZATION LAYER THAT ARE FORMED AFTER FORMATION OF A SEMICONDUCTOR DEVICE

BACKGROUND

1. Field of the Disclosure

The present disclosure generally relates to the fabrication of integrated circuits, and, more particularly, to various methods of forming a through-substrate-via (TSV) and a metallization layer after formation of a semiconductor device, and the resulting integrated circuit products.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar transistor devices, FinFET transistor devices, nanowire transistor devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region. In addition to transistors, which is an example of an active circuit element or semiconductor device, an integrated circuit product also includes passive circuit elements such as, for example, resistors, capacitors, etc.

In order for these circuit elements to function as part of an overall electrical circuit, electrical connections must be made to the circuit elements. In the case of a transistor, that typically involves establishing an electrical connection to the gate structure and to each of the source/drain regions. Typically, due to the large number of circuit elements and the required complex layout of modern integrated circuits, the electrical connections or "wiring arrangement" for the individual circuit elements cannot be established within the same device level on which the circuit elements are manufactured. Accordingly, the various electrical connections that constitute the overall wiring pattern for the integrated circuit product are formed in one or more additional stacked so-called "metallization layers" that are formed above the device level of the product. These metallization layers are typically comprised of layers of insulating material with conductive metal lines or conductive vias formed in the layers of insulating material. Generally, the conductive lines provide the intra-level electrical connections, while the conductive vias provide the inter-level connections or vertical connections between different levels of the conductive lines. These conductive lines and conductive vias may be comprised of a variety of different materials, e.g., copper, tungsten, aluminum, etc. (with appropriate barrier layers). The first metallization layer in an integrated circuit product is typically referred to as the "M1" layer. Normally, a plurality of conductive vias (typically referred to as "V0" vias) are used to establish electrical connection between the M1 layer and lower level conductive structures—so called device-level contacts (explained more fully below). In some more advanced devices, another metallization layer comprised of conductive lines (sometimes called the "M0" layer) is formed between the device level contacts and the V0 vias.

FIG. 1A is a cross-sectional view of an illustrative integrated circuit product 10 comprised of a plurality of transistor devices 11 formed in and above a semiconductor substrate 12. FIG. 1B is a simplistic plan view of a single transistor device 11. These drawings depict a plurality of so-called "CA contact" structures 14 for establishing electrical connection to the simplistically depicted source/drain regions 20 of the device 11, and a gate contact structure 16 which is sometimes referred to as a "CB contact" structure. As shown in FIG. 1B, the CB gate contact 16 is positioned vertically above the isolation material 13 that surrounds the device 11, i.e., the CB gate contact 16 is typically not positioned above the active region defined in the substrate 12, but it may be in some advanced architectures.

With reference to FIGS. 1A-1B, the transistors 11 comprise an illustrative gate structure 22, i.e., a gate insulation layer 22A and a gate electrode 22B, a gate cap layer 24, a sidewall spacer 26 and simplistically depicted source/drain regions 20. As noted above, the isolation region 13 has also been formed in the substrate 12 at this point in the process flow. At the point of fabrication depicted in FIG. 1A, layers of insulating material 30A, 30B, i.e., interlayer dielectric (ILD) materials, have been formed above the substrate 12. Other layers of material, such as contact etch stop layers and the like, are not depicted in the attached drawings. Also depicted are illustrative raised epi source/drain regions 32 and source/drain contact structures 34 which include a combination of a so-called "trench silicide" (TS) structure 36. The CA contact structures 14 may be in the form of discrete contact elements, i.e., one or more individual contact plugs having a generally square-like shape (as shown in FIG. 1B) or cylindrical shape when viewed from above, that are formed in the interlayer dielectric (ILD) materials. In other applications (not shown in FIG. 1B), the CA contact structures 14 may also be a line-type feature that contacts underlying line-type features, e.g., the TS structure 36 that contacts the source/drain region 20, and typically extends across the entire active region on the source/drain region 20 in a direction that is parallel to that of the gate structure 22.

Also depicted in FIG. 1A is the first metallization layer—the so-called M1 layer—of the multi-level metallization system for the product 10 that is formed in a layer of insulating material 38, e.g., a low-k insulating material. A plurality of conductive vias—so-called V0 vias 40—are provided to establish electrical connection between the device-level contacts—CA contacts 14 and the CB contact 16—and the M1 layer. The M1 layer typically includes a plurality of metal lines 42 that are routed as needed across the product 10.

In one embodiment, the process flow of forming the TS structures 36, CA contacts 14 and CB contacts 16 may be as follows. After the first layer of insulating material 30A is deposited, openings are formed in the first layer of insulating material 30A that expose at least portions of the epi material 32 positioned above the underlying source/drain regions 20. Thereafter, traditional silicide is formed through the openings, followed by forming tungsten (not separately shown) on the metal silicide regions, and performing a chemical mechanical polishing (CMP) process down to the top of the gate cap layer 24. Then, the second layer of insulating material 30B is deposited and contact openings for the CA contacts 14 are formed in the second layer of insulating material 30B that expose at least portions of the underlying tungsten metallization above the source/drain regions 20. Next, while the opening for the CA contacts 14 is masked, the opening for the CB contact 16 is formed in the second layer of insulating material 30B and through the gate cap layer 24 so as to expose a portion of the gate electrode 22B. Typically, the CB contact 16 is in the form of a round or square plug. Thereafter, the conductive CA contacts 14 and the conductive CB contact 16 are formed in their corresponding openings in the second layer of insulating material 30B by performing one or more common metal deposition and CMP process operations, using the second layer of insulating material 30B as a polish-stop layer to remove excess material positioned outside of the contact openings. The CA contacts 14 and CB contact 16 typically contain a uniform body of metal, e.g., tungsten, and may also include one or more metallic barrier layers (not shown) positioned between the uniform body of metal and the layer of insulating material 30B. The TS contacts 36, CA contacts 14 and the CB contact 16 are all considered to be device-level contacts within the industry.

FIG. 1C depicts an illustrative example of a product 10A that includes a so-called M0 metallization layer of the multi-level metallization system for the product 10A. The M0 layer is formed in a layer of insulating material 46, e.g., a low-k insulating material, between the V0 vias 40 and the device level contacts (CA contacts 14 and the CB contact 16). The M0 layer typically includes a plurality of metal lines 44 that are routed as needed across the product 10A. The formation of such an M0 metallization layer may be helpful in reducing the overall resistance of the circuits formed on the substrate 12.

The semiconductor devices, e.g., the transistors, and the metallization system for the IC product 10 are formed above a front side surface 12A (see FIG. 1A) of the substrate 12. TSVs (a Through-Substrate-Via which may sometimes be referred to as a Through-Silicon-Via) are formed so as to provide an electrical contact to the metallization system from the back side of the substrate 12. The use of TSVs can improve packing densities. One illustrative example of how a TSV 54 may be formed will be discussed with reference to FIGS. 1D-1E. In one illustrative process flow, sometimes referred to as a TSV first process operation, prior to the formation of any semiconductor devices on the front side 12A of the substrate 12, a trench 50 is etched into the substrate 12. Thereafter, a conformal liner 52 of an insulating material (such as silicon dioxide) is formed in the trench 50 and above the surface 12A of the substrate 12. Then, a conductive material, e.g., tungsten, copper, etc., was deposited so as to overfill the remaining un-filled portion of the trench 50. One or more CMP processes are then performed using the front face 12A of the substrate 12 as a polish-stop. These operations result in the formation of the TSV 54 as shown in FIG. 1D. Alternatively, the TSV may be formed after the devices are formed (Front End Of Line process operations) and after the device level contacts are formed (Middle Of Line process operations). The TSV is formed by forming a trench through the one or more interlayer dielectric (ILD) material layers of the device and into the substrate. The trench is overfilled with a conductive material such as copper. A CMP process that stops on the uppermost ILD layer is then performed to remove the excess amounts of the conductive material.

In a TSV first process flow, after the TSV 54 is formed, the semiconductor devices, e.g., the transistors 11 are formed above the front side 12A of the substrate 12. After the devices are formed, the metallization system (e.g., M0 layer, V0 via, M1 layer, etc.) for the product is formed above the front side 12A of the substrate 12. A part of the metallization system is formed so as to contact the front side 54S of the TSV 54, as indicated in FIG. 1E. After the metallization system is formed above the front side 12A of the substrate, a substrate thinning or trimming process is performed from the back side 12B of the substrate 12 to remove portions of the substrate 12 and expose a portion of the TSV 54. More specifically, with reference to FIG. 1E, the substrate 12 may be thinned until such time as the post-thinning back side surface 12B' of the substrate is at the position indicated by the dashed line. This thinning exposes a back side surface 54X of the TSV 54 that may be electrically contacted so as to provide access to the metallization system formed on the front side of the substrate. The above-described processes of forming a TSV and the metallization systems can be very complex and lead to performing a great number of processing steps, all which add cost and may lead to the generation of defects which can reduce production yields.

What are needed are more efficient and more integrated methods of forming a TSV and a metallization layer after formation of a semiconductor device that may avoid, or at least reduce, the effects of one or more of the problems identified above.

SUMMARY OF THE DISCLOSURE

The following presents a simplified summary of the disclosure in order to provide a basic understanding of some aspects of the subject matter that is described in further detail below. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the present disclosure is directed to various novel methods of forming a through-substrate-via (TSV) and a metallization layer after formation of a semiconductor device, and the resulting integrated circuit products. One illustrative integrated circuit product disclosed herein includes, among other things, a substrate, an interlayer dielectric (ILD) material positioned above the substrate, and a through-substrate-via (TSV) extending continuously through the substrate and the ILD material. The TSV includes a substrate portion of the TSV that is positioned in and extends continuously through the substrate and an ILD portion of the TSV that is positioned in and extends continuously through the ILD. Additionally, the illustrative integrated circuit product further includes an insulating liner layer that is selectively positioned between and separating the substrate portion of the TSV and the substrate, wherein the selectively positioned insulating liner layer does not extend from the substrate to the ILD material.

In another exemplary embodiment, an integrated circuit product is disclosed that includes a substrate, a metallization system positioned above the substrate and a through-substrate-via (TSV) extending continuously through the substrate and the metallization system. Additionally, the TSV includes a first TSV portion that is positioned in and extends continuously through the substrate and a second TSV portion that is positioned in and extends continuously through the metallization system, wherein the first TSV portion has first sidewalls and the second TSV portion has second sidewalls that are laterally offset from the first sidewalls. Furthermore, the illustrative integrated circuit product also includes an insulating liner layer that is selectively positioned between and separating the first TSV portion and the substrate, wherein the selectively positioned insulating liner layer does not extend from the substrate to the metallization system and is not positioned between and separating the second TSV portion and the metallization system.

Also disclosed herein is an illustrative integrated circuit product that includes, among other things, a substrate, an interlayer dielectric (ILD) material positioned above the substrate, at least one layer of insulating material positioned above the ILD material and a metallization system positioned above the at least one layer of insulating material, the metallization system including at least a first metallization layer. Furthermore, the exemplary integrated circuit product also includes at least one transistor device that is positioned in and above the substrate, wherein the ILD material laterally surrounds the at least one transistor device, at least one device level contact that is conductively coupled to the at least one transistor device, wherein the at least one device level contact is positioned in and extends continuously through the at least one layer of insulating material, and at least one conductive metallization element that is conductively coupled to the at least one device level contact, wherein the at least one conductive metallization element is positioned in the first metallization layer. Additionally, the integrated circuit product further includes a through-substrate-via (TSV) extending continuously through the substrate, the ILD material, the first layer of insulating material and the metallization system, wherein the TSV includes a first TSV portion that is positioned in and extends continuously through the substrate and a second TSV portion that is positioned in and extends continuously through the ILD material, the first layer of insulating material and the metallization system, wherein the first TSV portion has first sidewalls and the second TSV portion has second sidewalls that are laterally offset from the first sidewalls. Moreover, an insulating liner layer is selectively positioned between and separating the first TSV portion and the substrate, wherein the selectively positioned insulating liner layer does not extend from the substrate to the metallization system.

BRIEF DESCRIPTION OF THE DRAWINGS

The disclosure may be understood by reference to the following description taken in conjunction with the accompanying drawings, in which like reference numerals identify like elements, and in which:

FIGS. 1D-1E depict one illustrative example of a prior art TSV and how it may be manufactured;

FIGS. 2A-2I depict various novel methods disclosed herein for forming a through-substrate-via (TSV) and a metallization layer after formation of a semiconductor device;

FIGS. 3A-3E depict other novel methods disclosed herein for forming a through-substrate-via (TSV) and a metallization layer after formation of a semiconductor device;

FIGS. 4A-4F depict yet other novel methods disclosed herein for forming a through-substrate-via (TSV) and a metallization layer after formation of a semiconductor device; and FIGS. 5A-5G depict additional novel methods disclosed herein for forming a through-substrate-via (TSV) and a metallization layer after formation of a semiconductor device.

Figure 1A:
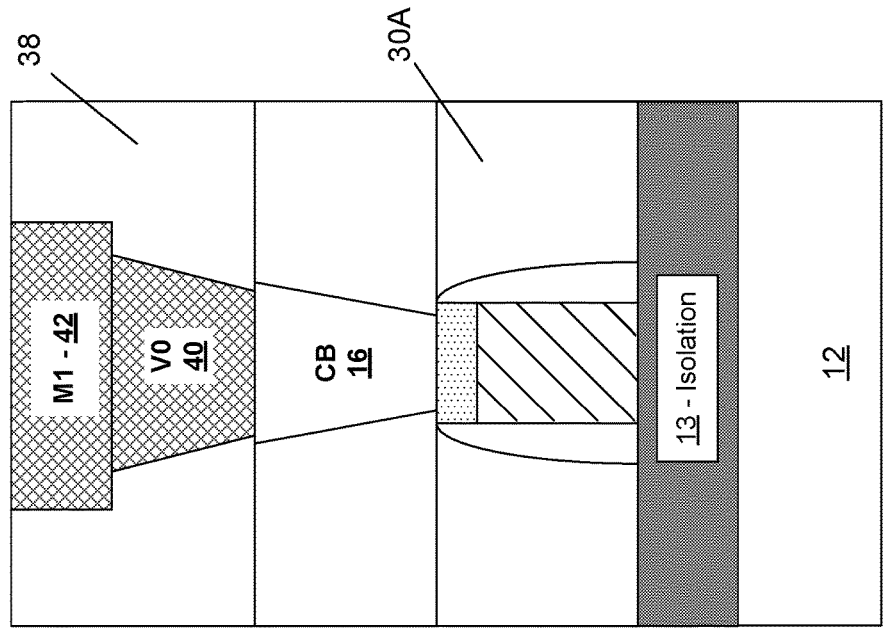
FIGS. 1A-1C depict various illustrative prior art arrangements of device-level contacts and metallization layers for an integrated circuit product.
Figure 1A:
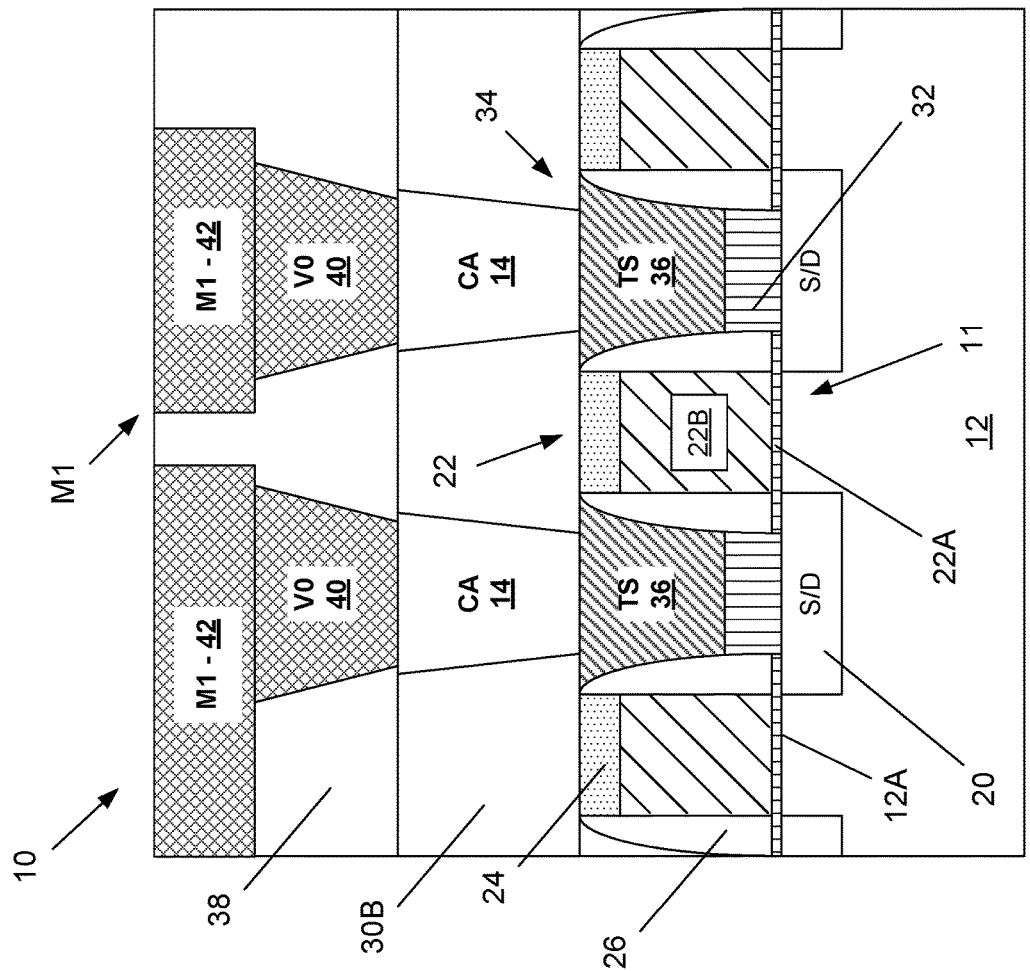
Figure 1B:
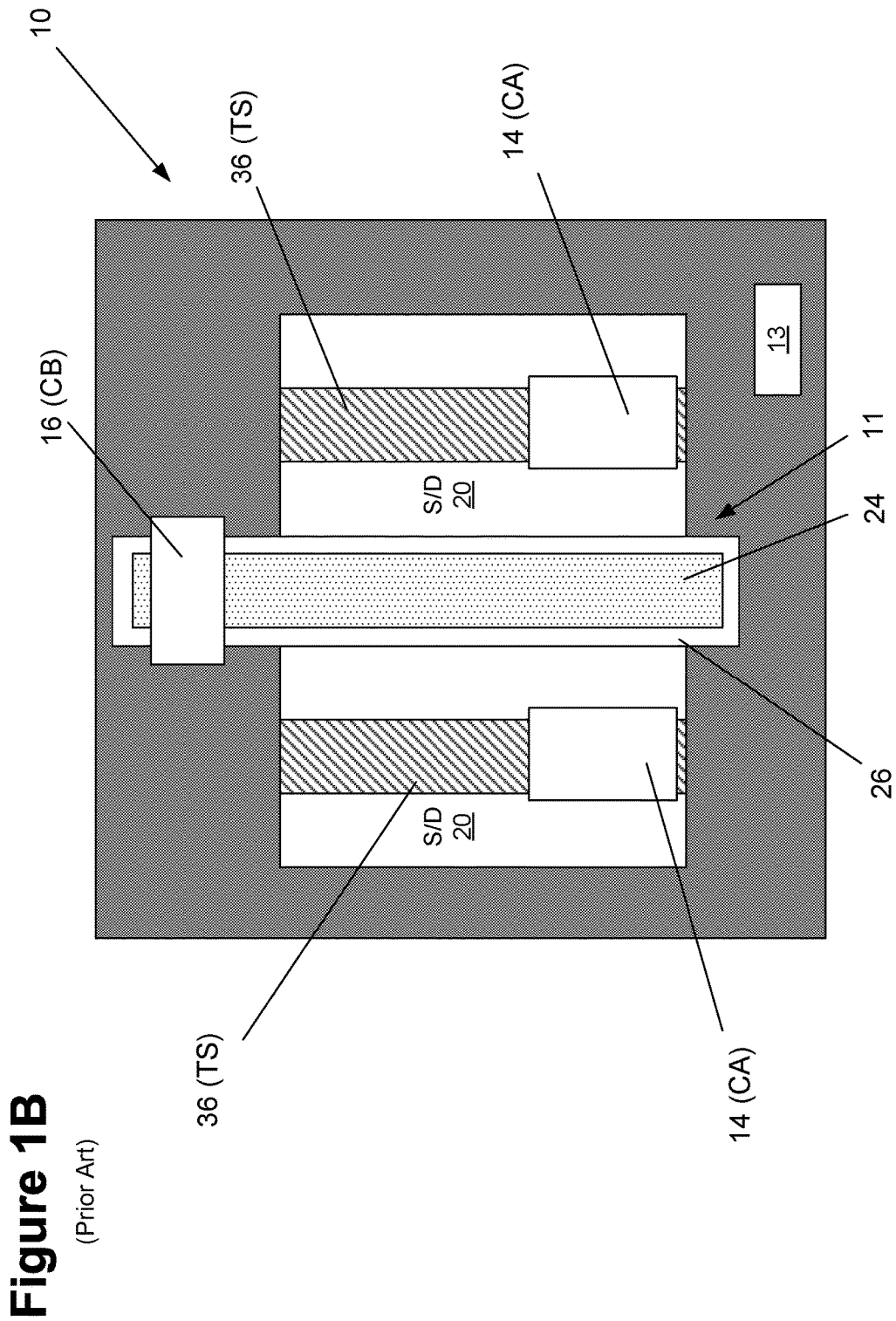
Figure 1C:
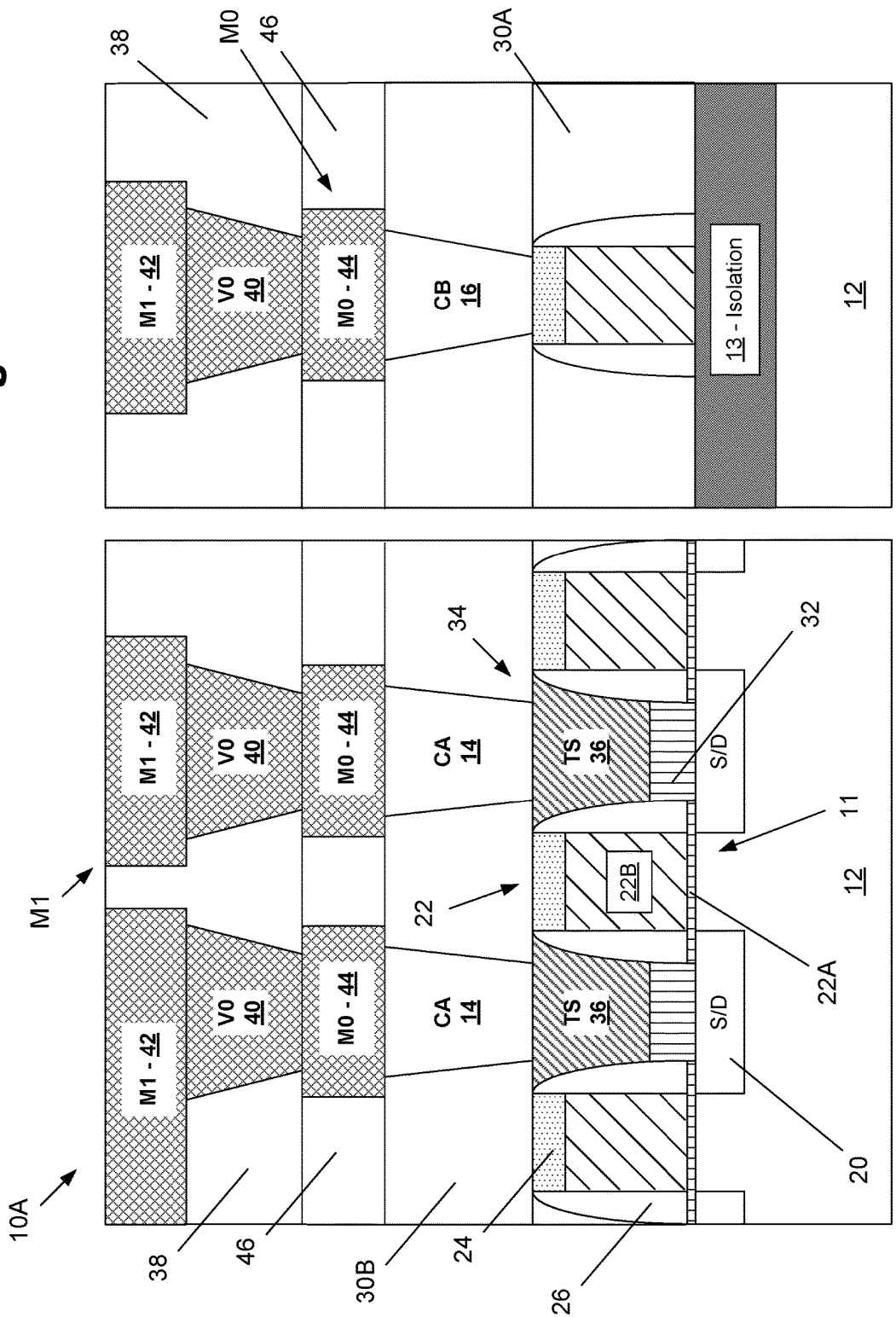

While the subject matter disclosed herein is susceptible to various modifications and alternative forms, specific embodiments thereof have been shown by way of example in the drawings and are herein described in detail. It should be understood, however, that the description herein of specific embodiments is not intended to limit the subject matter defined by the appended claims to the particular forms disclosed, but on the contrary, the intention is to cover all modifications, equivalents, and alternatives falling within the spirit and scope of the claimed subject matter.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various systems, structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As used in this description and in the appended claims, the terms "substantial" or "substantially" are intended to conform to the ordinary dictionary definition of that term, meaning "largely but not wholly that which is specified." As such, no geometrical or mathematical precision is intended by the use of terms such as "substantially flat," "substantially perpendicular," "substantially parallel," "substantially circular," "substantially elliptical," "substantially rectangular," "substantially square," "substantially aligned," and/or "substantially flush," and the like. Instead, the terms "substantial" or "substantially" are used in the sense that the described or claimed component or surface configuration, position, or orientation is intended to be manufactured, positioned, or oriented in such a configuration as a target. For example, the terms "substantial" or "substantially" should be interpreted to include components and surfaces that are manufactured, positioned, or oriented as close as is reasonably and customarily practicable within normally accepted tolerances for components of the type that are described and/or claimed. Furthermore, the use of phrases such as "substantially conform" or "substantially conforms" when describing the configuration or shape of a particular component or surface, such as by stating that "the configuration of the component substantially conforms to the configuration of a rectangular prism," should be interpreted in similar fashion.

Furthermore, it should be understood that, unless otherwise specifically indicated, any relative positional or directional terms that may be used in the descriptions set forth below—such as "upper," "lower," "above," "below," "over," "under," "top," "bottom," "vertical," "horizontal," "lateral," and the like—have been included so as to provide additional clarity to the description, and should be construed in light of that term's normal and everyday meaning relative to the depiction of the components or elements in the referenced figures. For example, referring to the cross-sectional view of the in-process device depicted in FIG. 2C, it should be understood that the substrate 102 is depicted as being positioned "under" or "below" the layer of insulating material 105, and the layers of insulating material 107, 109, 111, and 113 are depicted as being formed "over" or "above" the layer of insulating material 105 and "over" or "above" the substrate 102. Additionally, the "top" or "upper" surface 102A of the substrate 102 as shown in FIG. 2C is depicted as being substantially "horizontally" oriented, and the TSV trench is shown as extending in a substantially "vertical" direction through the substrate 102 and the material layers 105, 107, 109, 111, and 113 such that the "bottom" or "lower" surface of the trench is positioned "below" the upper surface 102A of the substrate 102.

The present disclosure is directed to various novel methods disclosed herein for forming a through-substrate-via (TSV) and a metallization layer after formation of a semiconductor device. The methods and devices disclosed herein may be employed in manufacturing products using a variety of technologies, e.g., NMOS, PMOS, CMOS, etc., and they may be employed in manufacturing a variety of different integrated circuit products, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, nanowire devices, etc. Thus, the presently disclosed inventions should not be considered to be limited to any particular form of transistors. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

Figure 2A:
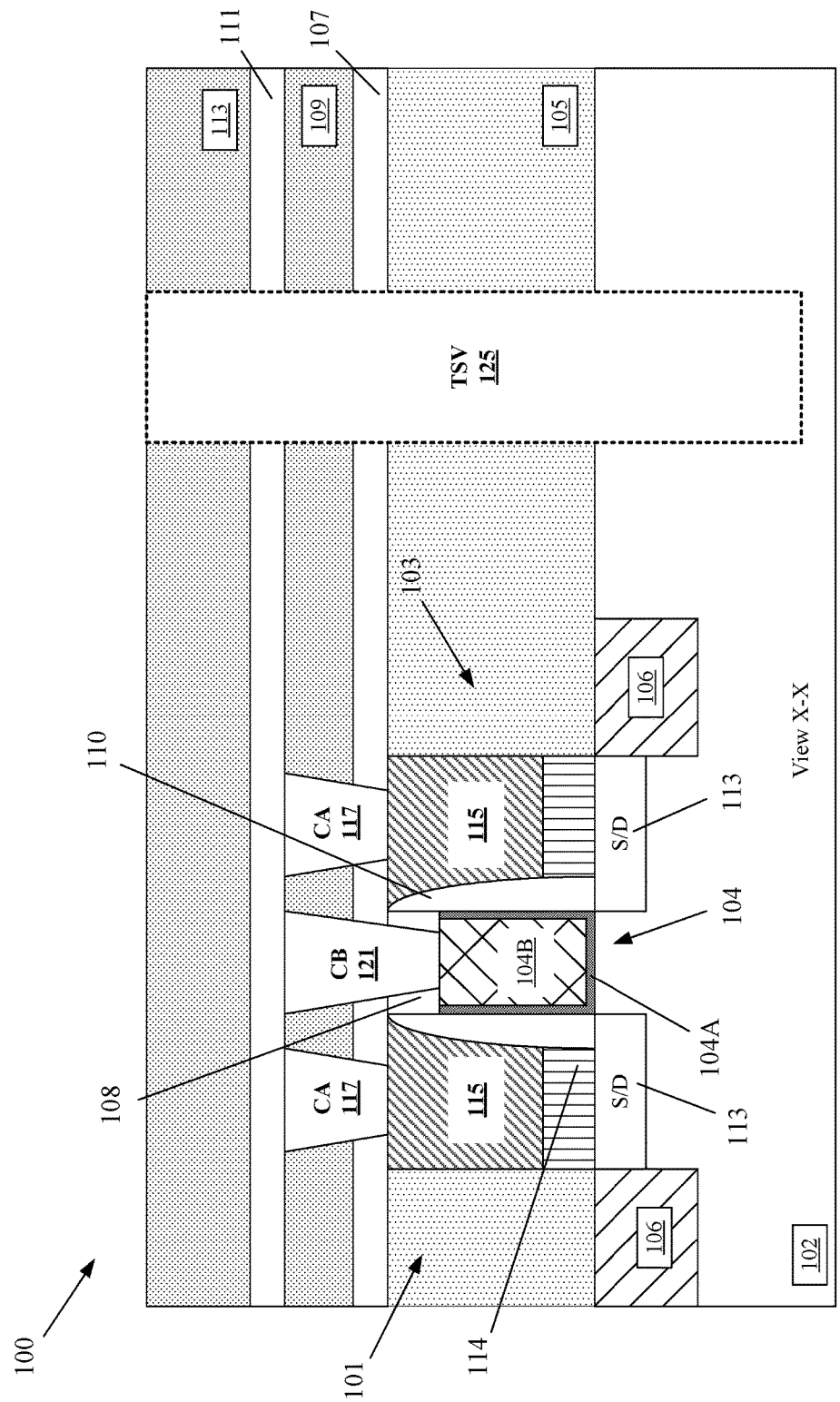
Figure 2B:
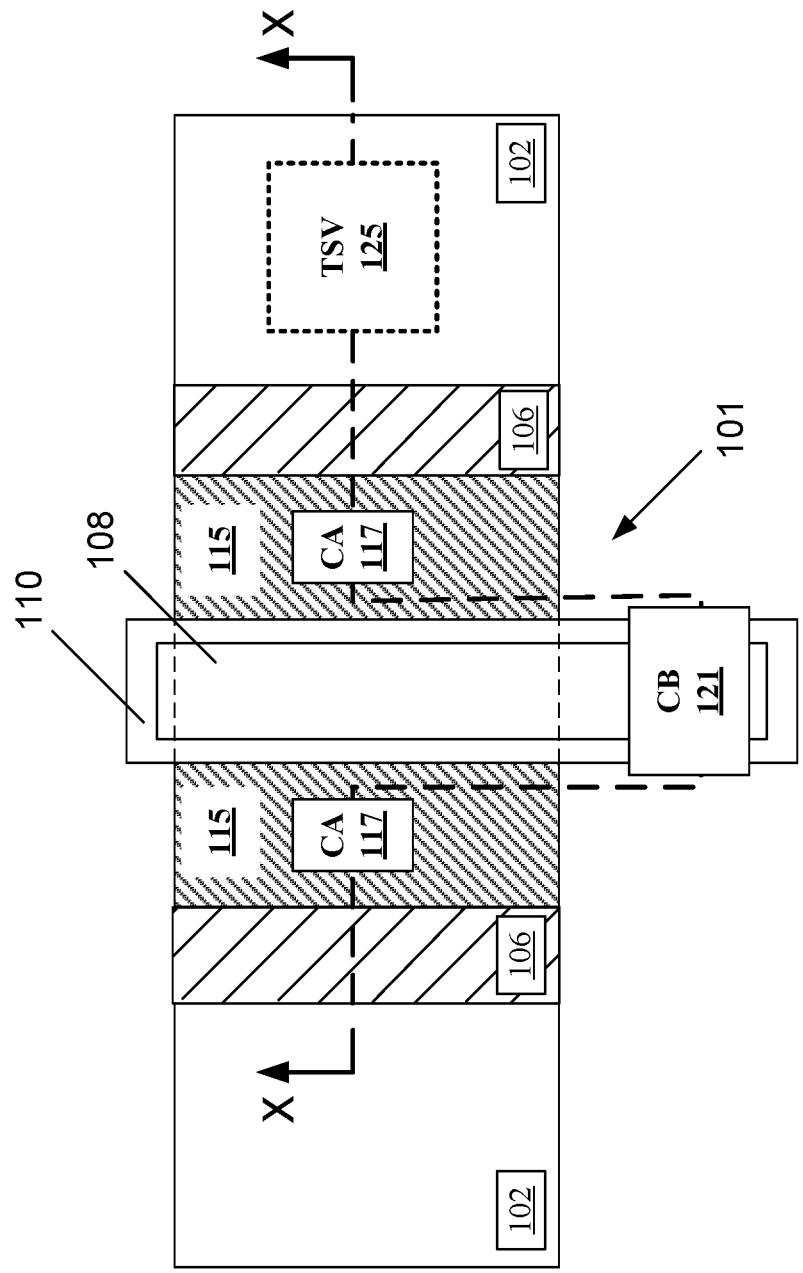
Figure 2C:
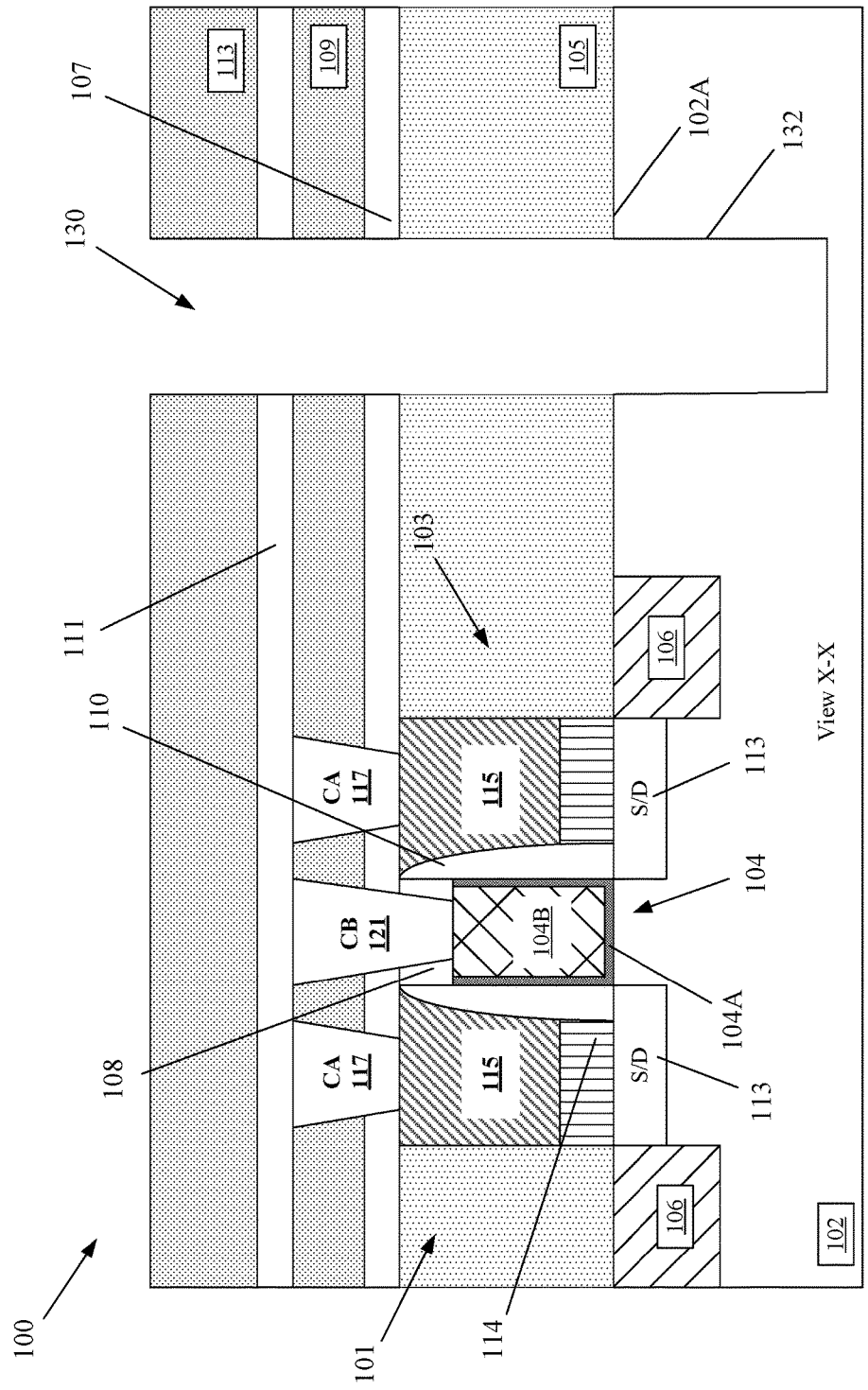

FIGS. 2A-2I depict various novel methods disclosed herein for forming an integrated circuit product 100 that comprises a semiconductor device 101, e.g., a transistor, a resistor, a capacitor, etc., and a TSV 125 that is formed in the substrate 102. The TSV 125 is depicted in dashed lines in FIGS. 2A-2B since it has not yet been formed at the point of processing depicted in FIGS. 2A-2B. That is, according to the methods disclosed herein, the TSV 125 will not be formed until after the formation of the semiconductor device 101. Also, note that the TSV 125 is not drawn to scale as it is much larger in size than the typical semiconductor devices 101 being manufactured in advanced integrated circuit products. In addition, the TSV 125 is also typically located a certain distance away from the devices 101 to mitigate TSV-induced stress on the device characteristics, typically this safe distance is referred to as the "keep-out" region. The semiconductor device 101 may be an active or passive semiconductor device, e.g., a transistor, a resistor, a capacitor, etc. In the examples depicted herein, the semiconductor device 101 is a planar transistor device 103. FIG. 2A is a cross-sectional view (X-X) of the product 100 taken where indicated in FIG. 2B. FIG. 2B is a simplistic plan view of the product 100 (with various layers of insulating material omitted) indicating where the cross-sectional views (view X-X) depicted herein are taken. As indicated, the CA contacts 117 and the CB contact 121 do not lie in the same horizontal plane (when viewed from above), thus the cross-sectional view (X-X) shown in the drawings is a stepped cross-sectional view so as to depict the CA (source/drain) contacts 117, the CB (gate) contact 121 and the formation of the TSV 125 after the semiconductor device 101 has been formed.

With continuing reference to FIGS. 2A-2B, the illustrative product 100 will be formed in and above a semiconductor substrate 102. The product 100 may comprise any type of semiconductor device 101, e.g., either NMOS transistors, PMOS transistors or both types of transistors, resistors, capacitors, etc. Additionally, various doped regions, e.g., doped well regions, halo implant regions and the like, are not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of semiconductor materials other than silicon. Thus, the terms "substrate" or "semiconductor substrate" should be understood to cover all semiconducting materials and all forms of such materials.

FIGS. 2A-2B depict the product 100 after several process operations were performed, i.e., after the semiconductor device 101 was formed and after the CA (source/drain) contacts 117 and the CB (gate) contact 121 were formed for the semiconductor device 101. The CA contacts 117 and the CB contact 121 will be referred to herein and in the claims as "device level contacts." As depicted in these drawings, the transistor device 103 is formed in and above the semiconductor substrate 102. A schematically depicted isolation region 106 has also been formed in the substrate 102 so as to electrically isolate the transistor 103 from other semiconductor devices. In the depicted example, the transistor device 103 is comprised of an illustrative gate structure 104, i.e., a gate insulation layer 104A and a gate electrode 104B, a gate cap layer 108, a sidewall spacer 110 and simplistically depicted source/drain regions 113. The gate structure 104 may be manufactured using either "gate-first" or "replacement gate" manufacturing techniques. The gate structure 104 may be comprised of a variety of different materials. In one illustrative embodiment, the gate insulation layer 104A may be comprised of a layer of silicon dioxide and/or a high-k (k value greater than 10) insulating material, such as hafnium oxide (or other high-k materials). The gate electrode 104B may be comprised of a variety of different types of conducting material, e.g., polysilicon, one or more conductive metal or metal alloy layers (e.g., titanium, titanium nitride), etc.

Also depicted in these drawings are illustrative raised epi source/drain regions 114 and conductive source/drain contact structures 115 which may include a so-called "trench silicide" (TS) material, although the source/drain contact structures 115 need not include such trench silicide materials. The conductive source/drain contact structures 115 are formed so as to establish electrical contact to the source/drain regions 113. The conductive source/drain contact structures 115 may be "line-type" structures or "point-type" structures in terms of their overall configuration when viewed from above. The conductive source/drain contact structures 115 are depicted as being "line-type" structures in FIG. 2B. At the point of fabrication depicted in FIGS. 2A-2B, a layer of insulating material 105, e.g., an ILD comprised of, for example, silicon dioxide, and other layers of insulating material 107, 109, 111 and 113 have been formed above the substrate 102. In one illustrative embodiment, the layers of insulating material 109, 113 may be comprised of a low-k insulating material (having a k value less than about 3.5) while the layers of insulating material 107, 111 may function as etch stop layers and may be comprised of a material such as silicon nitride, silicon oxynitride, etc. The layers of material 105, 107, 109, 111 and 113 may be formed to any desired thickness. Other layers of material, such as contact etch stop layers, are not shown so as not to overly complicate the drawings.

FIG. 2C depicts the product 100 after a patterned masking layer (not shown), e.g., a layer of photoresist, an anti-reflective coating layer and a planarizing layer, was formed above the layer of insulating material 113 and patterned and after a plurality of etching processes were performed through the patterned masking layer to define a TSV contact opening 130 in the layers of insulating material 105, 107, 109, 111, 113 and a TSV trench 132 in the substrate 102. The size, depth and configuration of the TSV trench 132 may vary depending upon the particular application. In one illustrative example, the aspect ratio (width to depth) of the TSV trench 132 may fall within the range of about 1:10-1:17 and the depth of the TSV trench 132 below the upper surface 102A of the substrate 102 may be about 100 µm. As discussed more fully below, a TSV 125 will eventually be formed in the TSV trench 132 and a contact 145 to the TSV 125 will eventually be formed in the TSV contact opening 130 by performing one or more common processing operations.

FIG. 2D depicts the product after several process operations were performed. First, the patterned masking layer (not shown) was removed. Then, a conformal insulating liner layer 134 was formed across the product 100 in the opening 130 and in the TSV trench 132 by performing a conformal deposition process. Thereafter, another conformal deposition process was formed to form a representative liner layer 136 that may be comprised of one or more layers of material. The liner layer(s) 136 may comprise one or more barrier material layers to reduce or prevent migration of conductive material that will be formed in the opening 130 into the surrounding layers of insulating material. Next, a layer of sacrificial material 138 (e.g., spin on carbon, OPL) was formed above the product 100 so as to over-fill the opening 130. Finally, a representative masking layer 139 was formed above the sacrificial material layer 138. The thickness of the liner layers 134, 136 may vary depending upon the particular application, and they each may be formed by performing a conformal ALD or CVD process. The liner layer 134 may be comprised of a variety of insulating materials, e.g., silicon dioxide, silicon oyxnitride, etc. The liner layer(s) 136 may be comprised of materials such as tantalum, tantalum nitride, titanium, titanium nitride, ruthenium, etc. The masking layer 139 may be a tri-layer masking layer comprised of a first layer 139A, a second layer 139B and a third layer 139C that are sequentially deposited across the product 100. In one illustrative example, the tri-layer masking layer 139 may be comprised of SOH/BARC/PR and in another embodiment it may be comprised of OPL/SiARC/PR, where a layer of photoresist (PR) is the uppermost layer 139C.

Figure 2E:
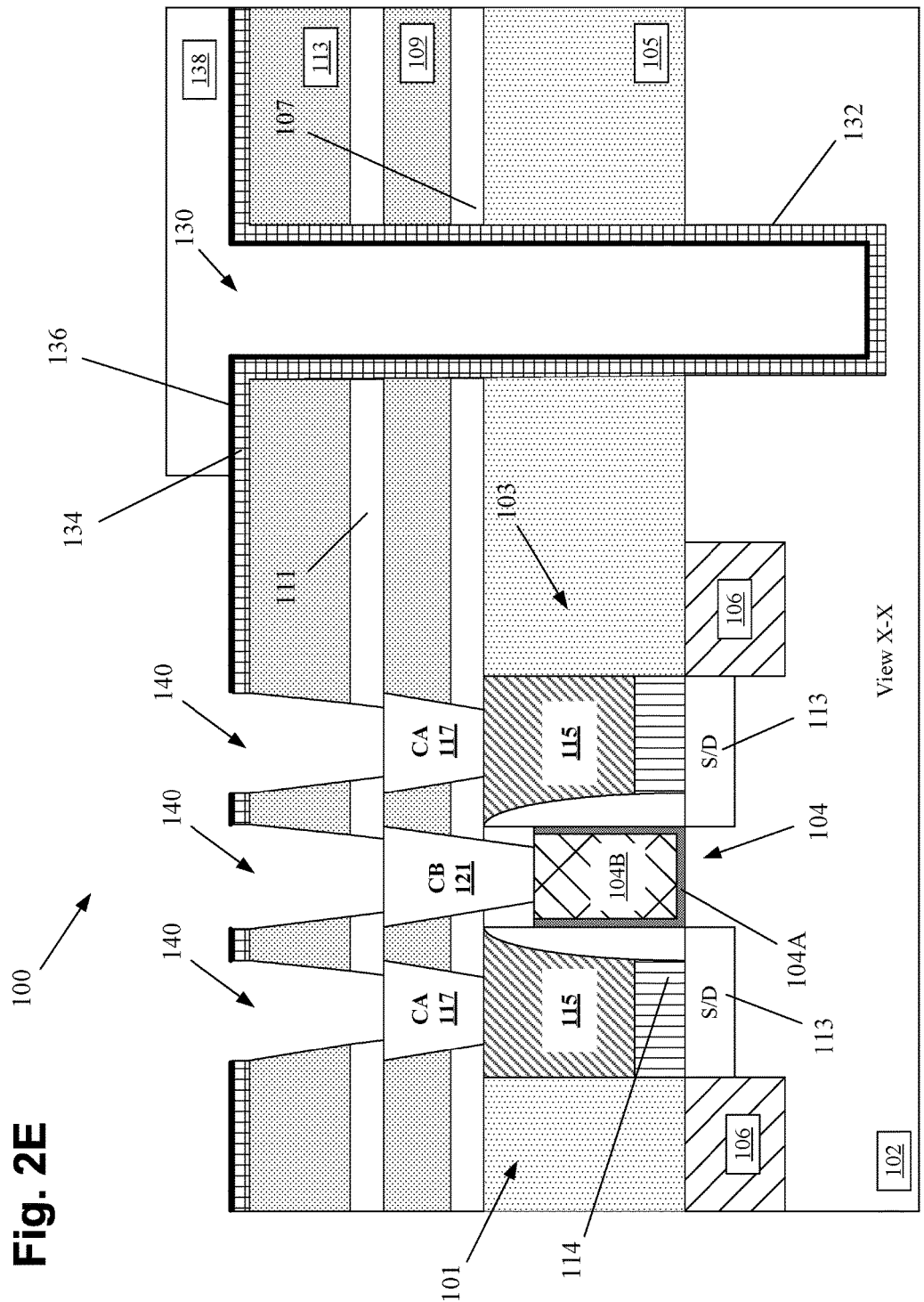

FIG. 2E depicts the product after several process operations were performed. First, the masking layer 139 was patterned so as to have openings that correspond to metallization contact openings 140 for a plurality of conductive metallization elements 144 (discussed more fully below) wherein the conductive metallization elements 144 are generic elements of a metallization layer or metallization system for the product 100, e.g., the conductive metallization elements 144 may be conductive lines in an M0 layer or conductive vias in a V0 layer. Thereafter, one or more etching processes were performed through the patterned masking layer 139 so as to define the metallization contact openings 140 that extend through the layers of insulating material 113, 111 and expose at least a portion of the CA contacts 117 and the CB contact 121. Thereafter, the masking layer 139 was further patterned and an etching process was performed to remove portions of the sacrificial material layer 138. The patterned masking layer 139 was then removed to leave the structure depicted in FIG. 2E.

Figure 2F:
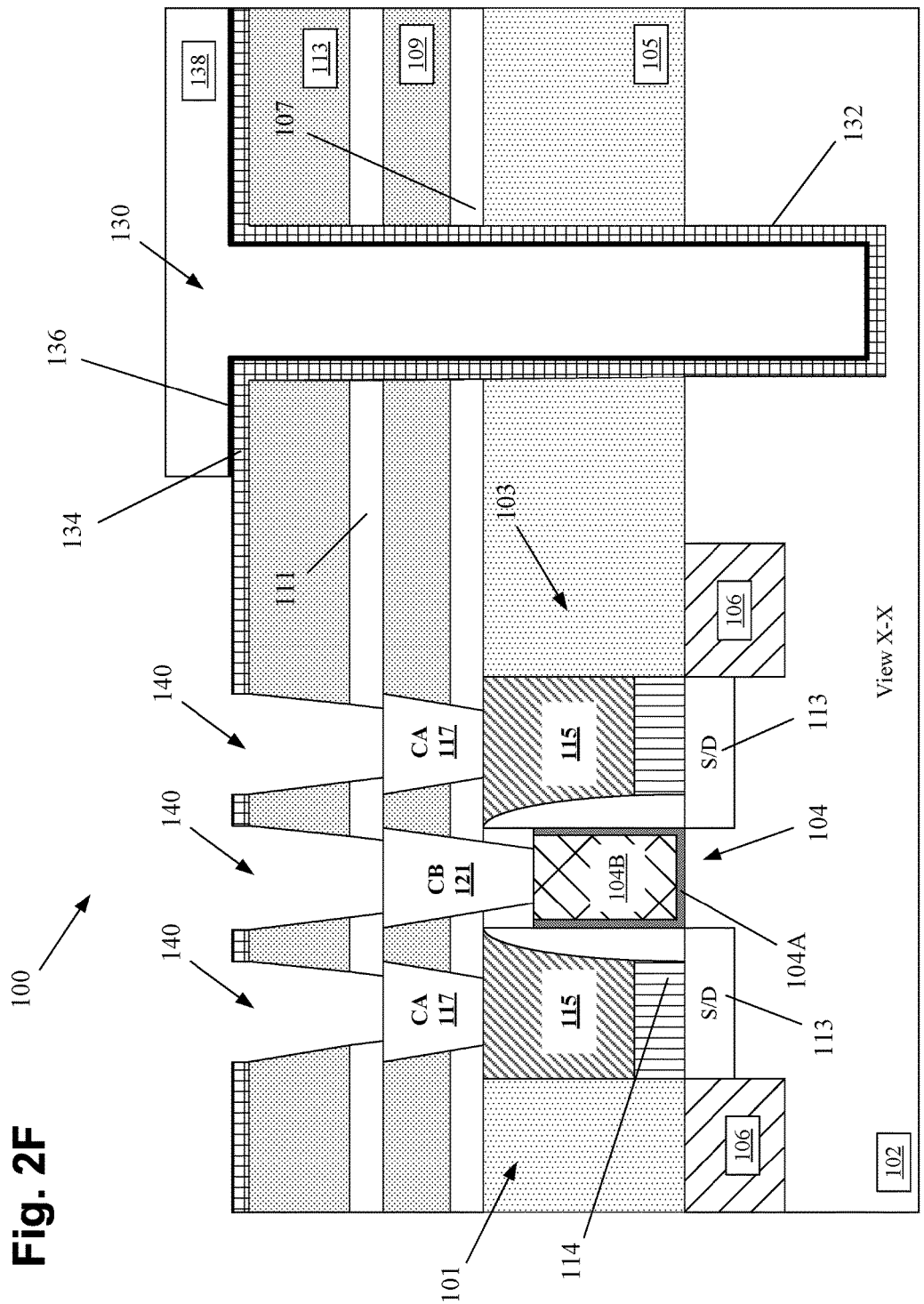

FIG. 2F depicts the product 100 after an etching process was performed using the patterned sacrificial material layer 138 as an etch mask so as to remove exposed portions of the liner layer 136 relative to the surrounding materials.

FIG. 2G depicts the product after several process operations were performed. First, the remaining portions of the sacrificial material layer 138 were removed. Then, another conformal deposition process was formed to form a representative liner layer 142 that may be comprised of one or more layers of material. The liner layer 142 is depicted as a dashed line so as to distinguish it from the liner layer 136. The liner layer(s) 142 may comprise one or more barrier material layers like those described above with reference to the liner layer 136. Note that the TSV contact opening 130 and the TSV trench 132 have two barrier liner layers 136, 142 formed therein, whereas the metallization contact openings 140 may have only the barrier layer 142 formed therein so as to prevent migration of conductive materials into the surrounding layers of insulating material.

Figure 2H:
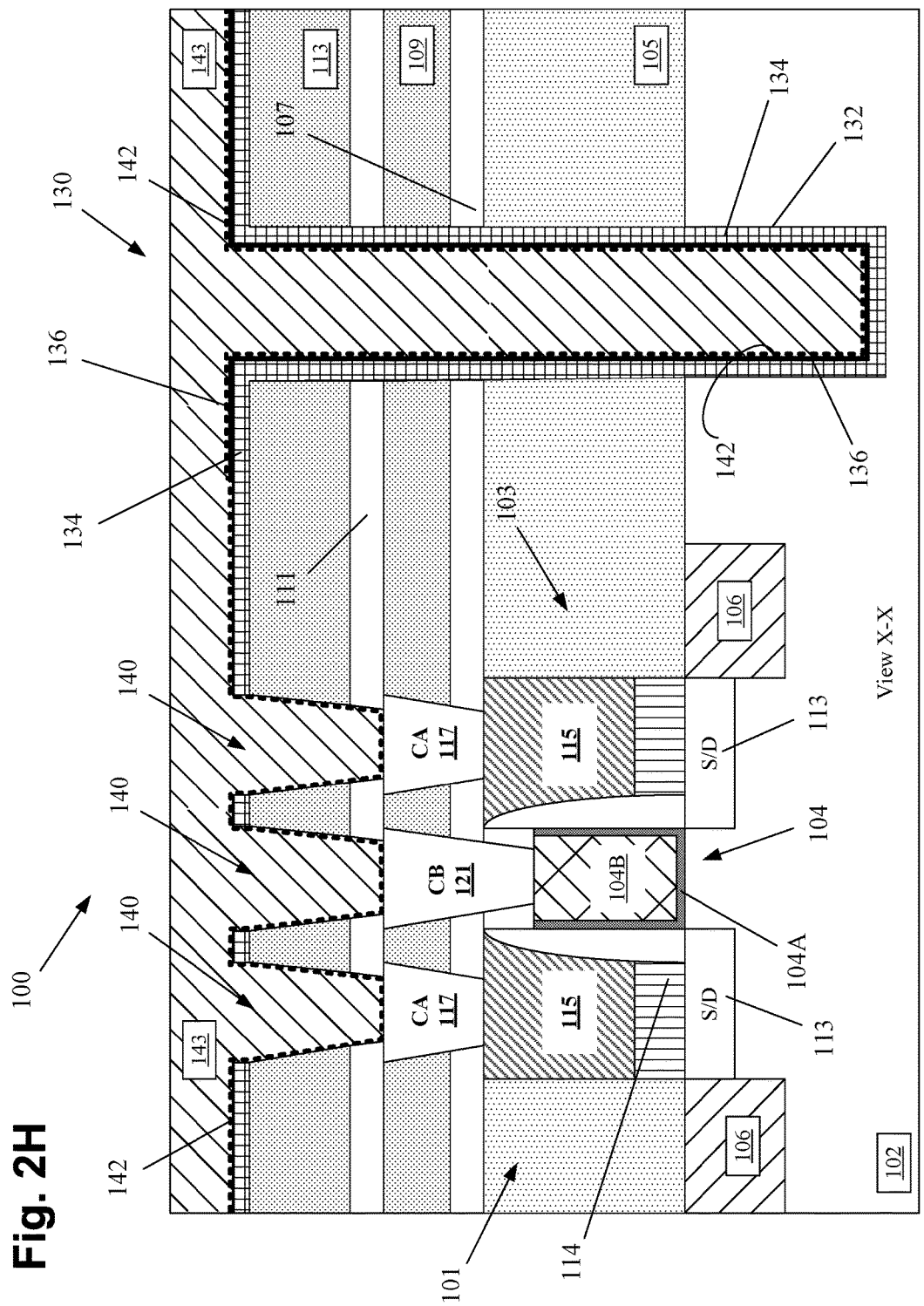

FIG. 2H depicts the product after one or more common deposition processes were performed to form one or more conductive material(s) 143 for the plurality of conductive metallization elements 144, the TSV 125 and the TSV contact structure 145 across the product 100 so as to over-fill the remaining un-filled portions of the metallization contact openings 140, the TSV trench 132 and the opening 130 at the same time.

Figure 2I:
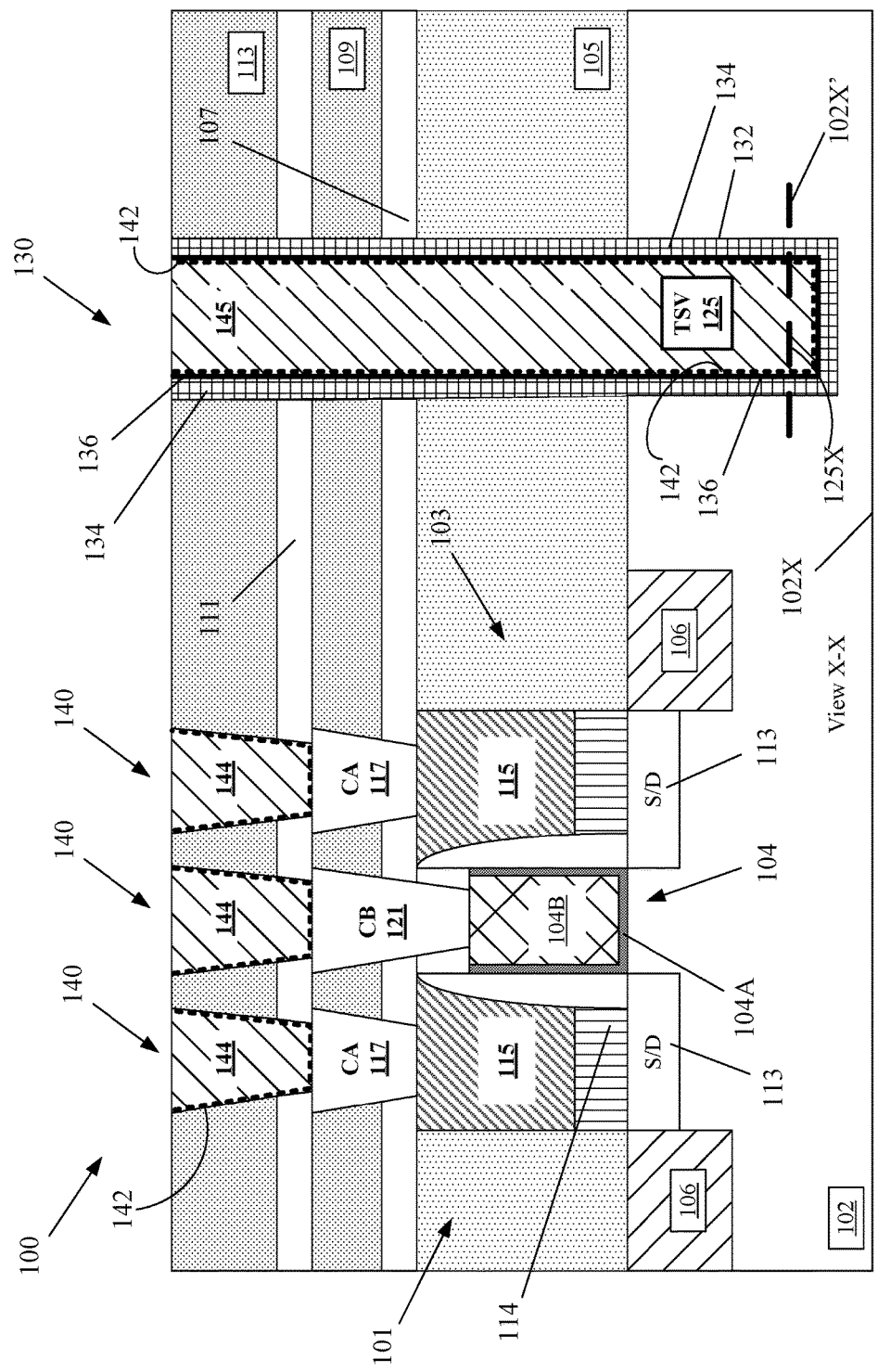

FIG. 2I depicts the product 100 after one or more planarization processes, such as CMP processes, were performed to remove excess portions of the conductive material 143 positioned outside of the metallization contact openings 140 and the opening 130 above the upper surface of the layer of insulating material 113 at the same time. The common planarization process operations result in the formation of the plurality of conductive metallization elements 144, the TSV contact structure 145 and the TSV 125 in the trench 132 in the substrate 102. At this point, additional metallization layers (not shown) comprised of additional metallization elements (not shown) may be formed above the product depicted in FIG. 2I. After completing the formation of the entire metallization system for the product 100, the back side 102X of the substrate 102 may be thinned such that it is in the location indicated by the dashed line 102X' in FIG. 2I, thereby exposing a back side 125X of the TSV 125. The conductive material(s) 143 for the conductive metallization elements 144, the TSV 125 and the TSV contact structure 145 may be comprised of one or more of a variety of different conductive materials, e.g., a metal, a metal alloy, copper, tungsten, cobalt, aluminum, ruthenium, tantalum, rhodium, etc.

Figure 3B:
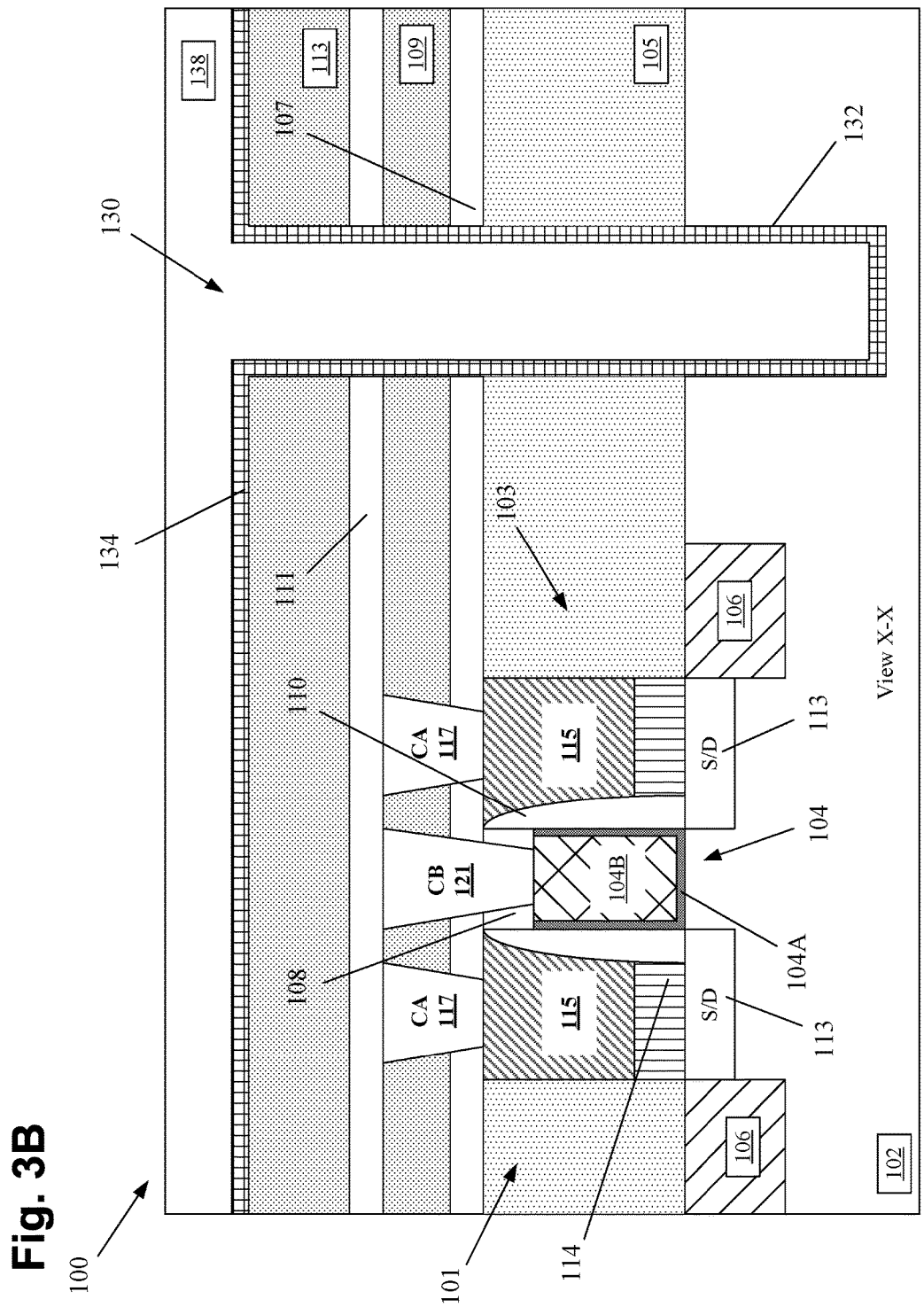

FIGS. 3A-3E depict other novel methods disclosed herein for forming a through-substrate-via (TSV) and a metallization layer after formation of a semiconductor device. FIG. 3A depicts the product 100 at a point in fabrication that corresponds to that shown in FIG. 2C, i.e., after the opening 130 was formed in the layers of insulating material 105, 107, 109, 111, 113 and after the TSV trench 132 was formed in the substrate 102.

FIG. 3B depicts the product after the above-described conformal insulating liner layer 134 was formed across the product 100 in the opening 130 and in the TSV trench 132 and after the above-described layer of sacrificial material 138 was formed above the product 100 so as to over-fill the opening 130. The above-described masking layer 139 would also be present above the layer of sacrificial material 138 but it is not depicted in FIG. 3B.

Figure 3C:
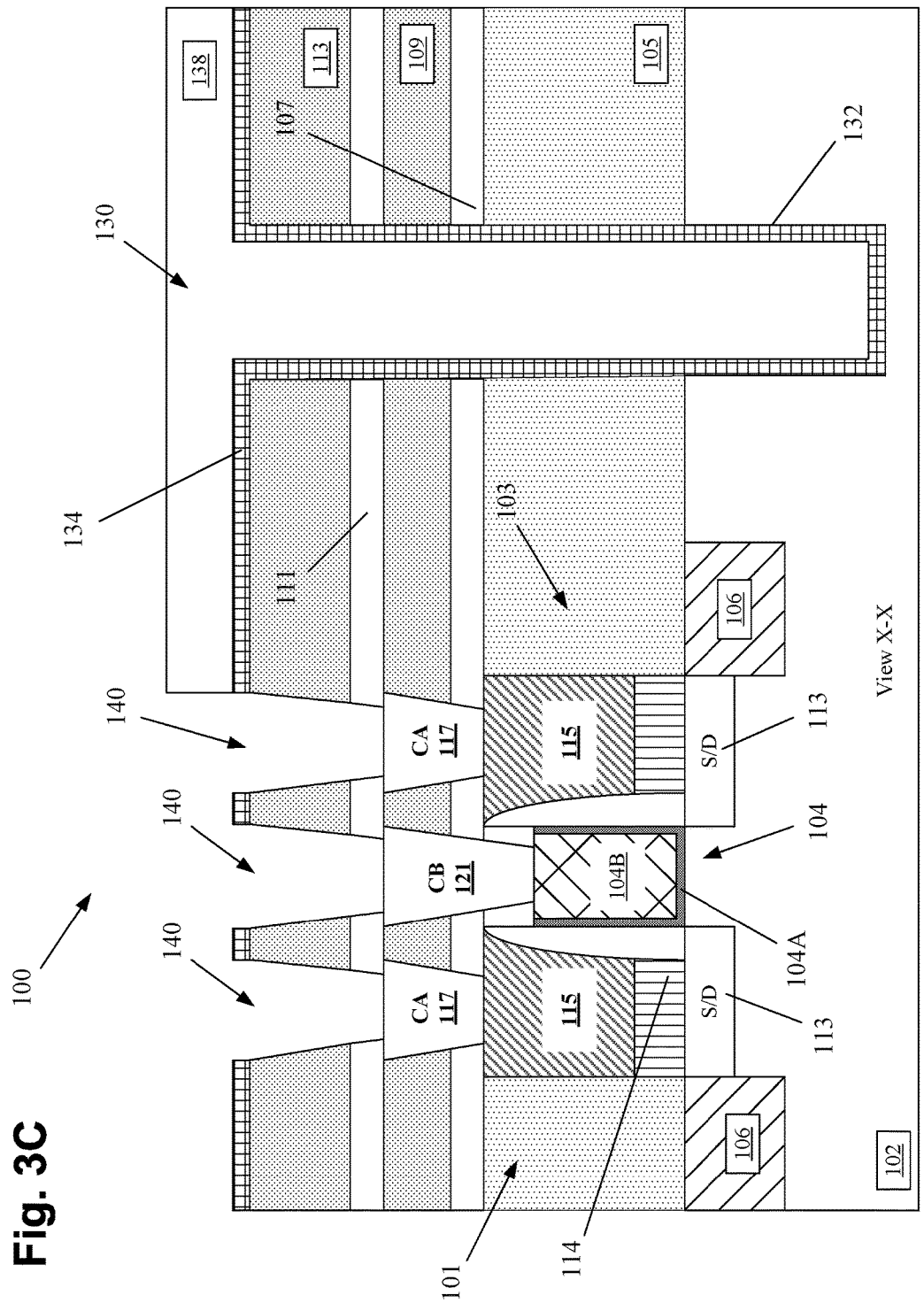

FIG. 3C depicts the product after several process operations were performed. First, the masking layer 139 (not shown in FIG. 3C) was patterned so as to have openings that correspond to metallization contact openings 140 for the above-described conductive metallization elements 144. Thereafter, one or more etching processes were performed through the patterned masking layer 139 so as to define the metallization contact openings 140 that extend through the layers of insulating material 113, 111 and expose at least a portion of the CA contacts 117 and the CB contact 121. Portions of the liner layer 134 are also removed during these etching processes. Thereafter, the masking layer 139 was further patterned and an etching process was performed to remove portions of the sacrificial material layer 138. The patterned masking layer 139 was then removed to leave the structure depicted in FIG. 3C.

Figure 3D:
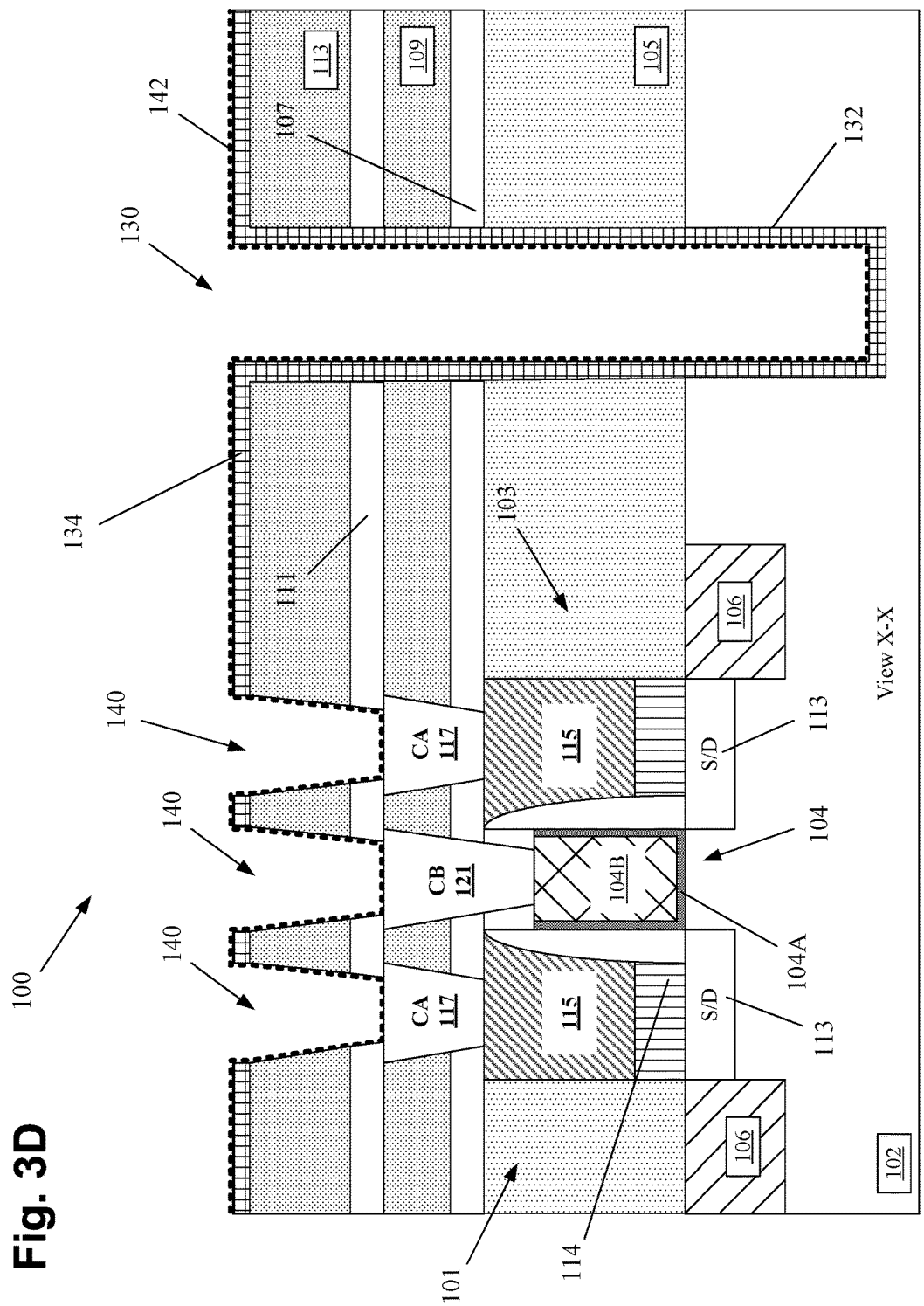

FIG. 3D depicts the product after several process operations were performed. First, the remaining portions of the sacrificial material layer 138 were removed. Then, another conformal deposition process was formed to form the above-described representative liner layer 142 in the opening 130, the TSV trench 132 and the metallization contact openings 140.

FIG. 3E depicts the product after the above-described process operations were performed to form the conductive metallization elements 144 in the openings 140, the TSV 125 in the TSV trench 132 and the TSV contact structure 145 in the opening 130, i.e., deposition of conductive materials, CMP, etc., as shown in FIGS. 2H-2I. At this point, additional metallization layers (not shown) comprised of additional metallization elements (not shown) may be formed above the product depicted in FIG. 3E. After completing the formation of the entire metallization system for the product 100, the back side 102X of the substrate 102 may be thinned as described above in connection with FIG. 2I.

Figure 4B:
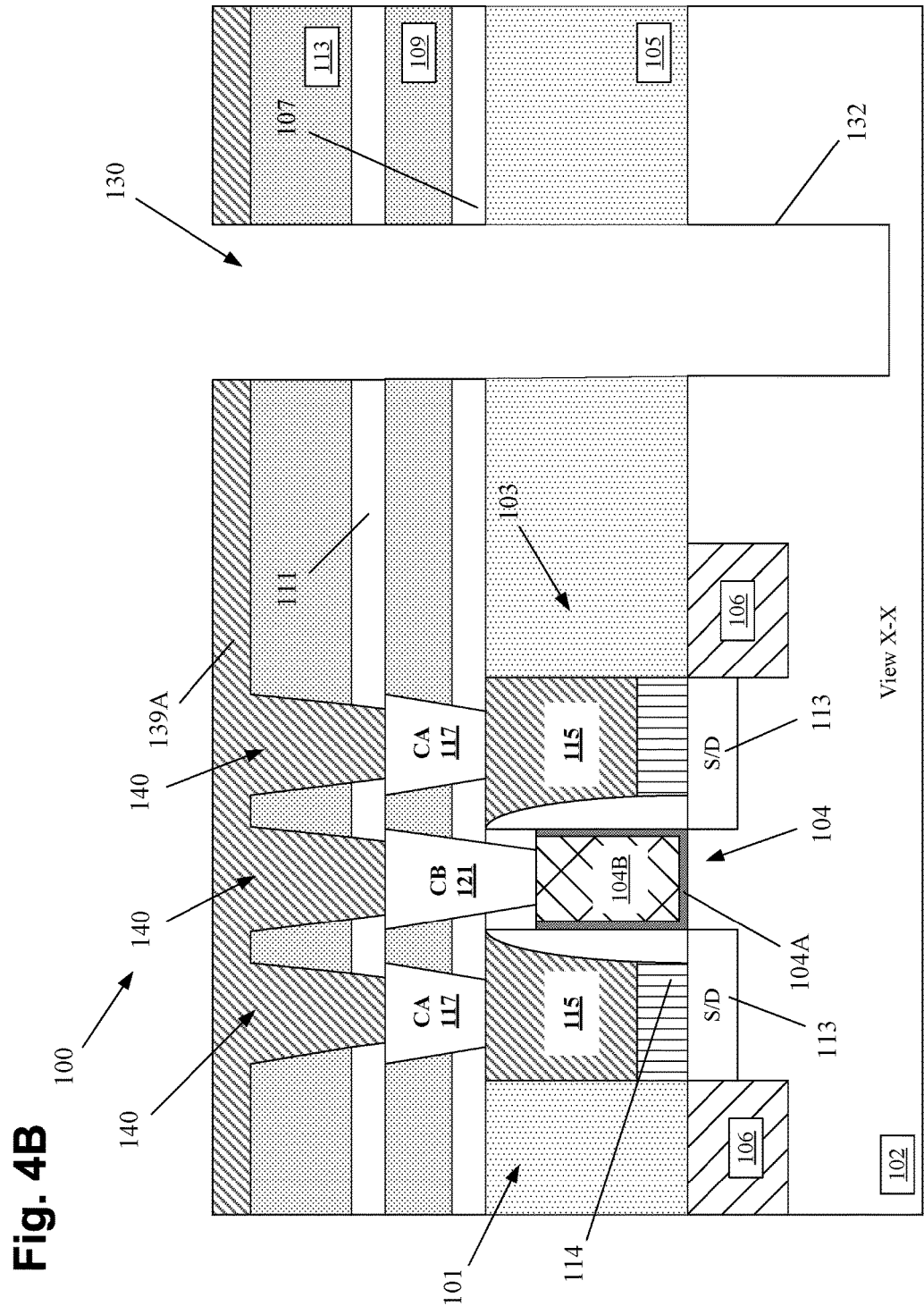

FIGS. 4A-4F depict yet other novel methods disclosed herein for forming a through-substrate-via (TSV) and a metallization layer after formation of a semiconductor device. FIG. 4A depicts the product 100 after several process operations were performed. First, a patterned masking layer (not shown), e.g., a patterned layer of photoresist, was formed above the layer of insulating material 113 and a plurality of etching processes were performed through the patterned masking layer to define the above-described metallization contact openings 140. Then, the patterned masking layer was removed. Thereafter, the above-described masking layer 139 was formed above the product 100 so as to over-fill the metallization contact openings 140.

FIG. 4B depicts the product after several process operations were performed. First, the masking layer 139 was patterned so as to have an opening that corresponds to opening 130 in the layers of insulating material 105, 107, 109, 111, 113 and the TSV trench 132. Thereafter, a plurality of etching processes were performed through the patterned masking layer 139 to define the opening 130 and the TSV trench 132.

FIG. 4C depicts the product after several process operations were performed. First, the remaining portions of the patterned masking layer 139 were removed. Then, as an optional step, a low temperature oxidation process, such as a chemical oxidation process, was performed to selectively form an insulating liner layer 150 (e.g., silicon dioxide) in the TSV trench 132. Alternatively, the liner layer 150 may be formed by performing a selective deposition process whereby the oxide material is only deposited on the exposed substrate surfaces in the TSV trench 132.

Figure 4D:
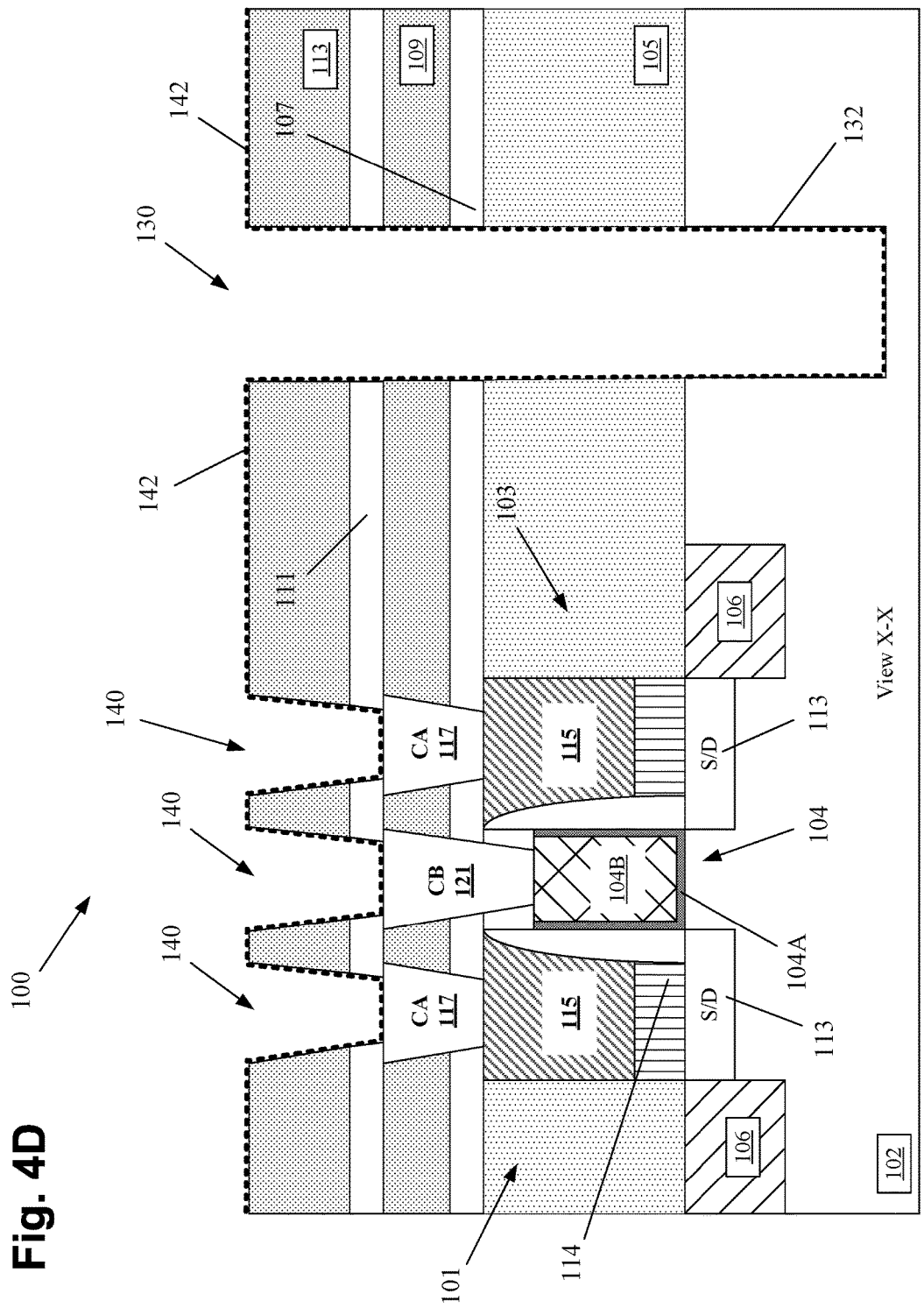

FIG. 4D depicts the product after several process operations were performed and wherein the liner layer 150 was not formed in the TSV trench 132. Starting from the product depicted in FIG. 4B, the remaining portions of the sacrificial material layer were removed. Thereafter, the above-described representative liner layer 142 was formed in the TSV contact opening 130, the TSV trench 132 and the metallization contact openings 140.

Figure 4E:
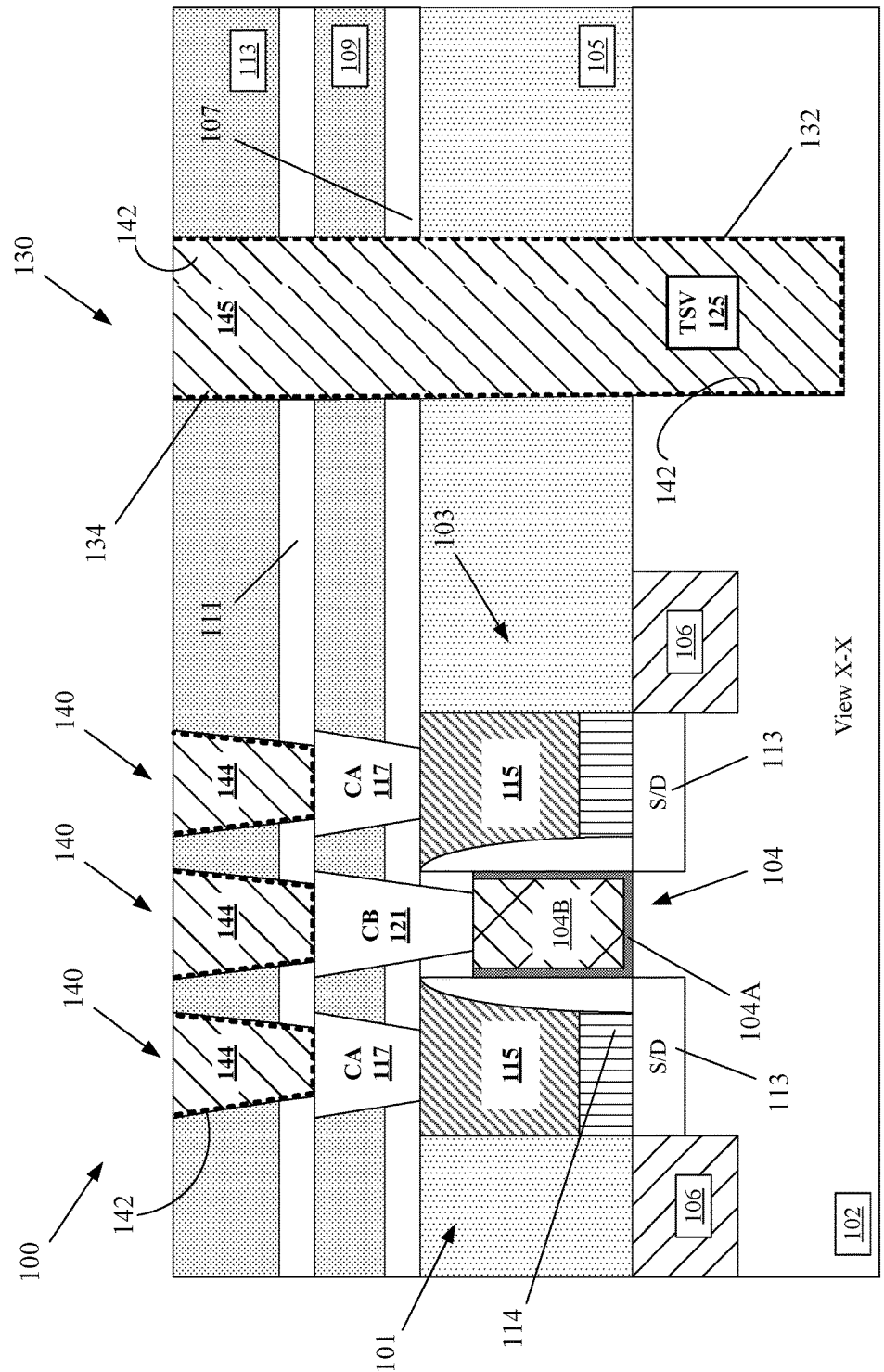

FIG. 4E depicts the product after the above-described process operations were performed to form the conductive metallization elements 144 in the openings 140, the TSV 125 in the TSV trench 132 and the TSV contact structure 145 in the opening 130, i.e., deposition of conductive materials, CMP, etc., as shown in FIGS. 2H-2I. At this point, additional metallization layers (not shown) comprised of additional metallization elements (not shown) may be formed above the product depicted in FIG. 4E. After completing the formation of the entire metallization system for the product 100, the back side 102X of the substrate 102 may be thinned as described above in connection with FIG. 2I.

Figure 4F:
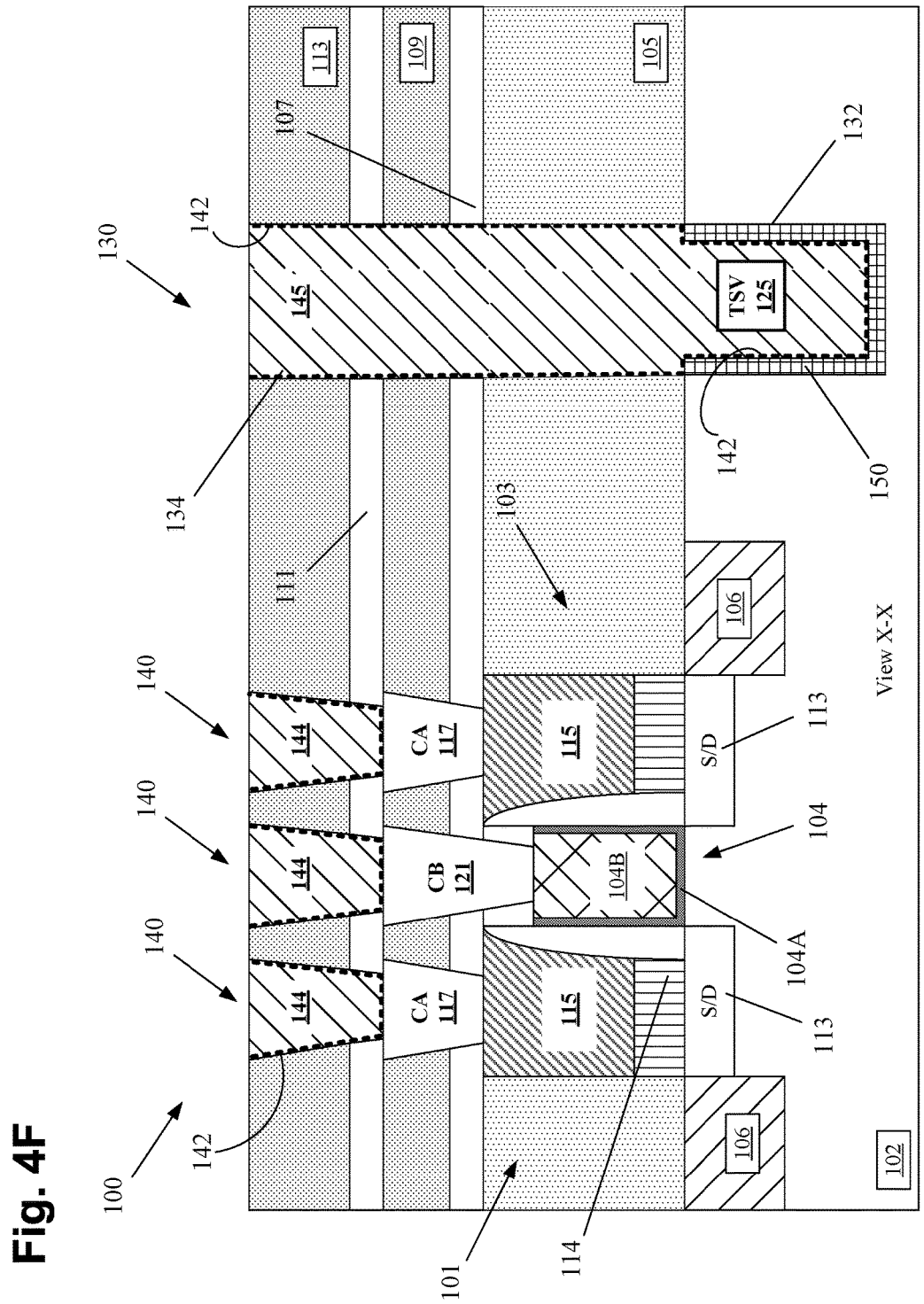

FIG. 4F depicts the product 100 in the case where the above-described liner layer 150 was formed in the TSV trench 132. Note the unique product 100 resulting from this process flow due to the selective formation of the liner layer 150 on the substrate 102 within the trench 132.

Figure 5B:
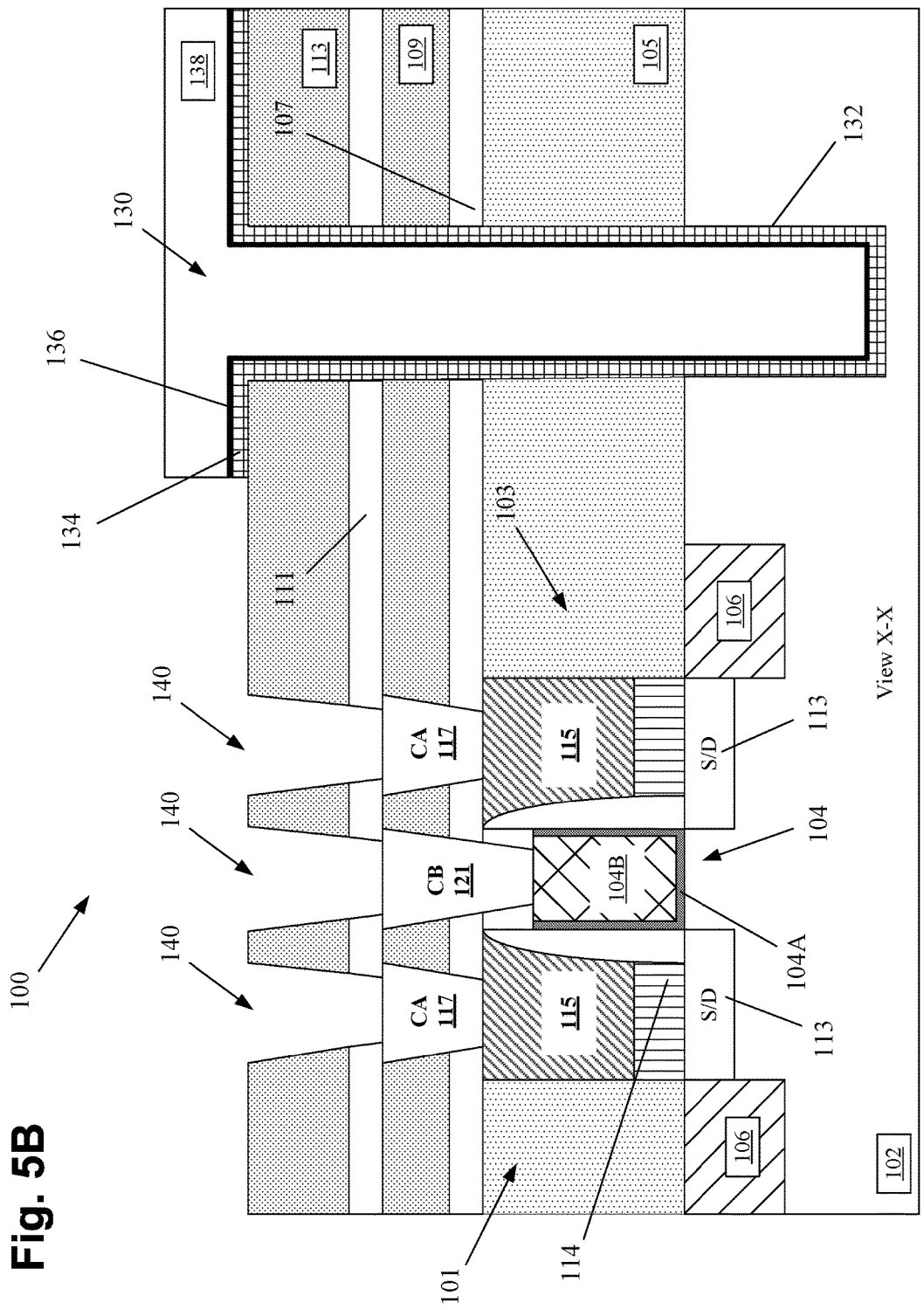

FIGS. 5A-5G depict additional novel methods disclosed herein for forming a through-substrate-via (TSV) and a metallization layer after formation of a semiconductor device. FIG. 5A depicts the product after several process operations were performed. First, a patterned masking layer (not shown), e.g., a patterned layer of photoresist, was formed above the layer of insulating material 113. Then, a plurality of etching processes were performed through the patterned masking layer to define the opening 130 in the layers of insulating material 105, 107, 109, 111, 113 and the TSV trench 132 in the substrate 102. Next, the above-described conformal insulating liner layer 134 was formed across the product 100, in the TSV contact opening 130 and in the TSV trench 132. Thereafter, the above-described representative liner layer 136 was formed across the product 100, in the opening 130 and the TSV trench 132 on the liner layer 134. Lastly, the above-described sacrificial material layer 138 was formed across the product 100 and in the opening 130 and the TSV trench 132. The above-described masking layer 139 would also be present above the layer of sacrificial material 138 but it is not depicted in FIG. 5A.

FIG. 5B depicts the product after several process operations were performed. First, the masking layer 139 was patterned so as to have openings that correspond to metallization contact openings 140 for the above-described conductive metallization elements 144. Thereafter, one or more etching processes were performed through the patterned masking layer 139 so as to define the metallization contact openings 140 that extend through the layers of insulating material 113, 111 and expose at least a portion of the CA contacts 117 and the CB contact 121. Thereafter, the masking layer 139 was further patterned and an etching process was performed to remove portions of the sacrificial material layer 138, the oxide liner layer 134 and the metal liner layer 136. The patterned masking layer 139 was then removed to leave the structure depicted in FIG. 5B.

Figure 5C:
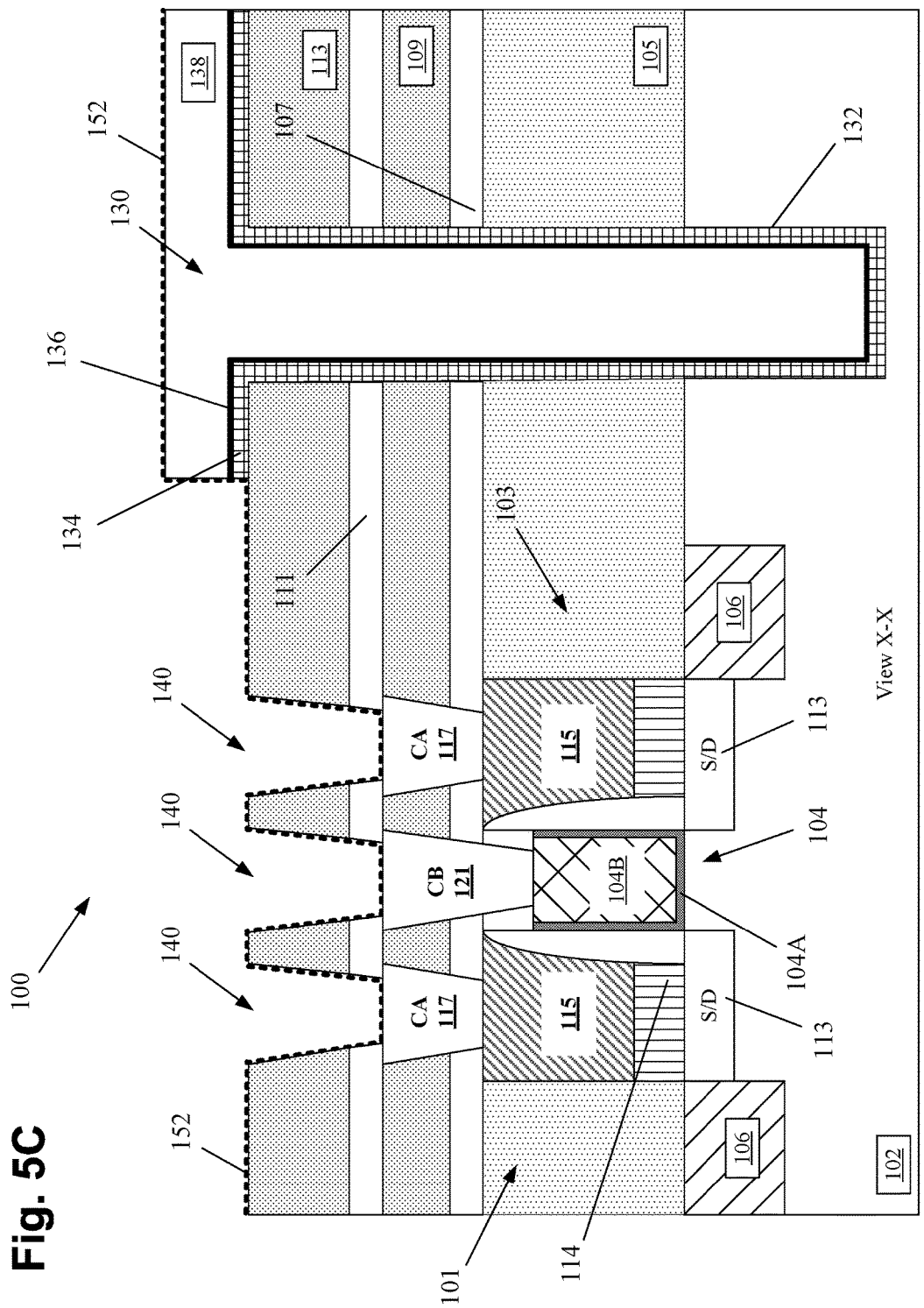

FIG. 5C depicts the product after a conformal liner layer 152 was formed across the product 100 and in the metallization contact openings 140 by performing a conformal deposition process. The liner layer(s) 152 may comprise one or more barrier material layers to reduce or prevent migration of conductive material that will be formed in the TSV contact opening 130 into the surrounding layers of insulating material. The liner layer(s) 152 may be comprised of materials such as tantalum, tantalum nitride, titanium, titanium nitride, ruthenium, cobalt, etc.

Figure 5D:
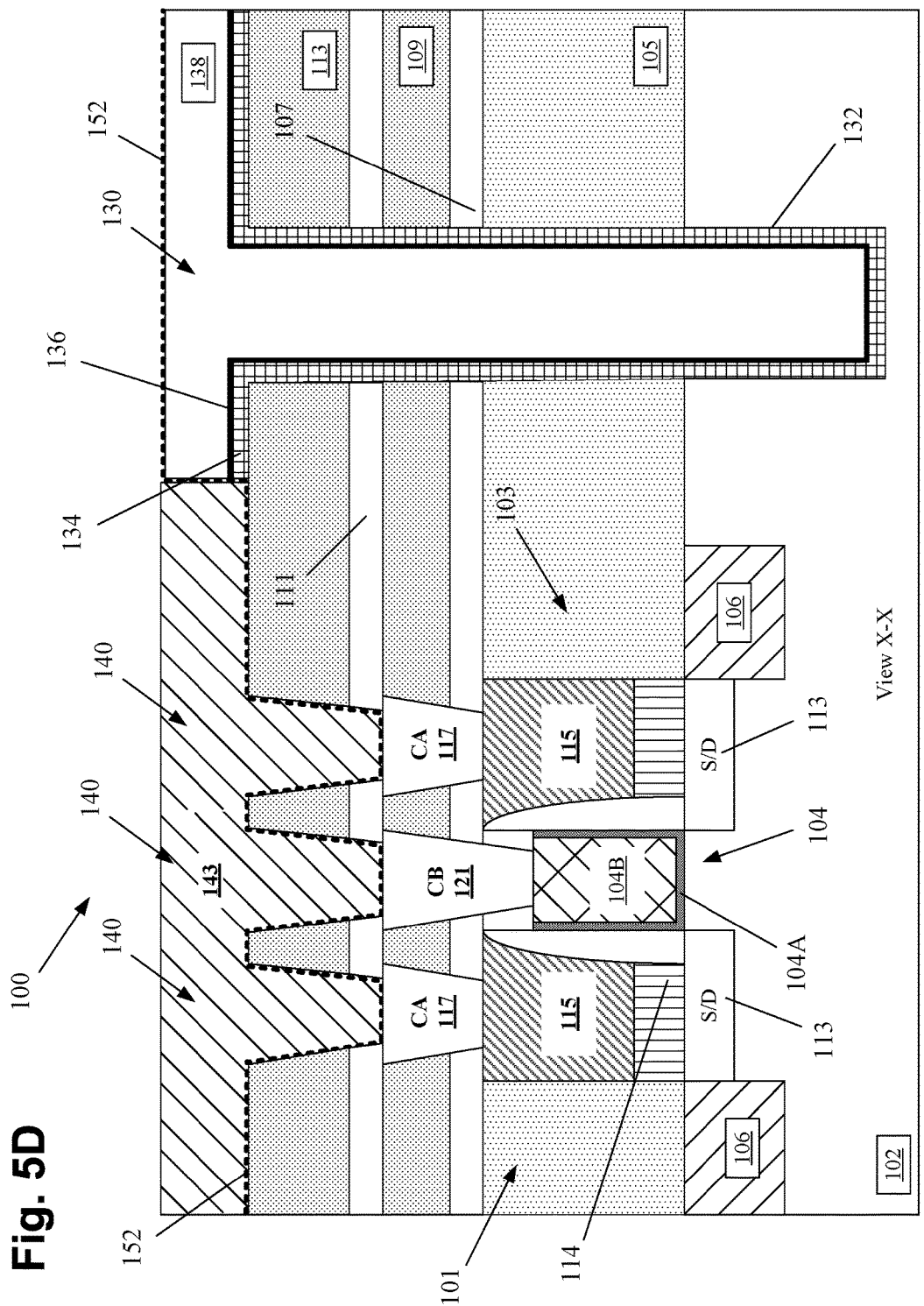

FIG. 5D depicts the product after several process operations were performed. First, one or more deposition processes were performed to form the above-described conductive material(s) 143 in the metallization contact openings 140 for the plurality of conductive metallization elements 144. Thereafter, one or more planarization processes, such as CMP processes, were performed using the liner layer 152 as a polish-stop (an end-point) layer.

Figure 5E:
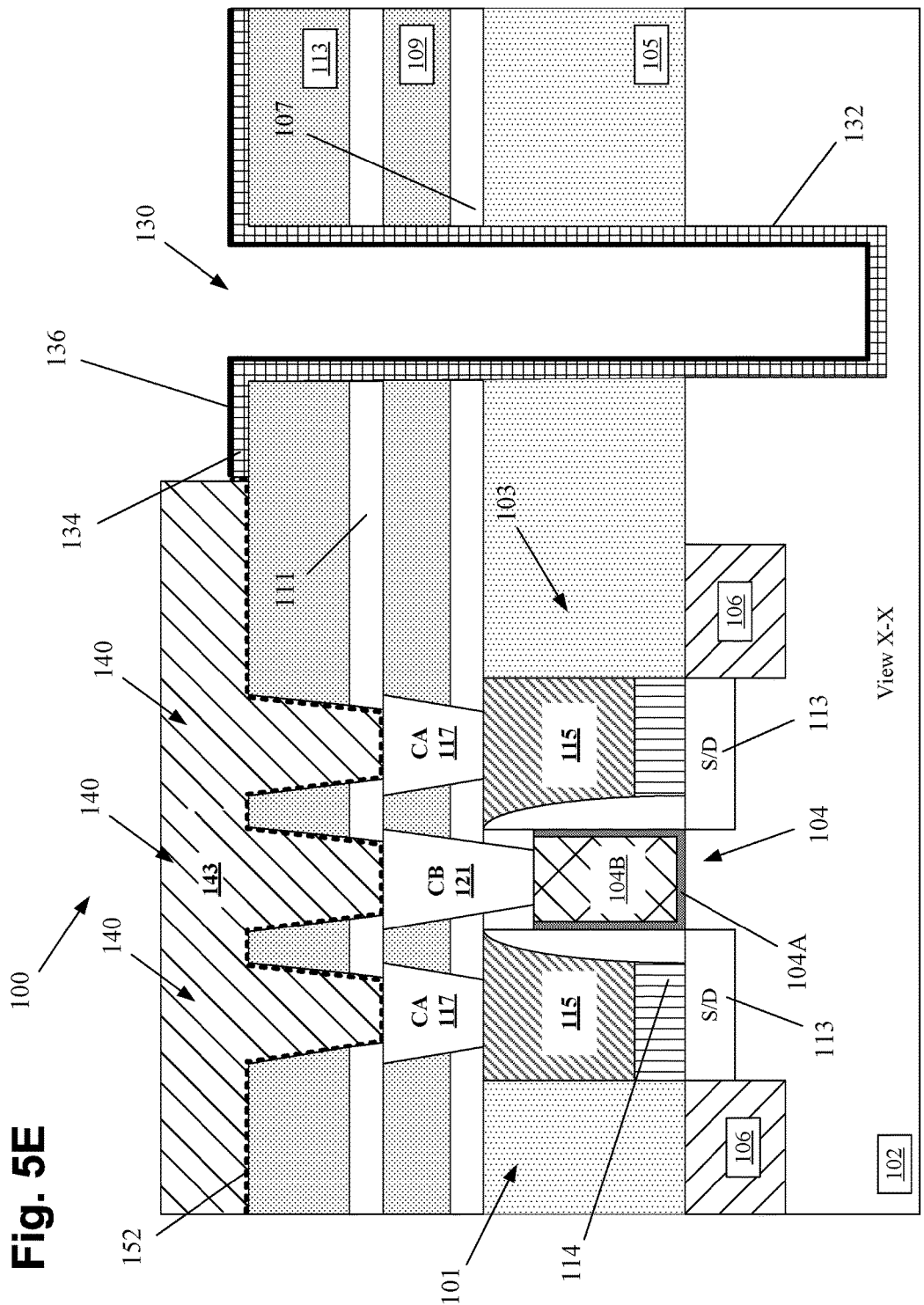

FIG. 5E depicts the product after several process operations were performed. First an etching process was performed to remove portions of the liner layer 152. Thereafter, the remaining portions of the sacrificial material layer 138 were removed.

FIG. 5F depicts the product after several process operations were performed. First, one or more deposition processes were performed to form conductive material(s) 147 in the TSV contact opening 130 for the TSV contact 145 and in the TSV trench 132 for the TSV 125. In one embodiment, the conductive materials 147 may be comprised of any of the materials mentioned above for the conductive material 143. In some applications, the conductive materials 143 and 147 may be comprised of the same material but that may not be the case in all applications.

Figure 5G:
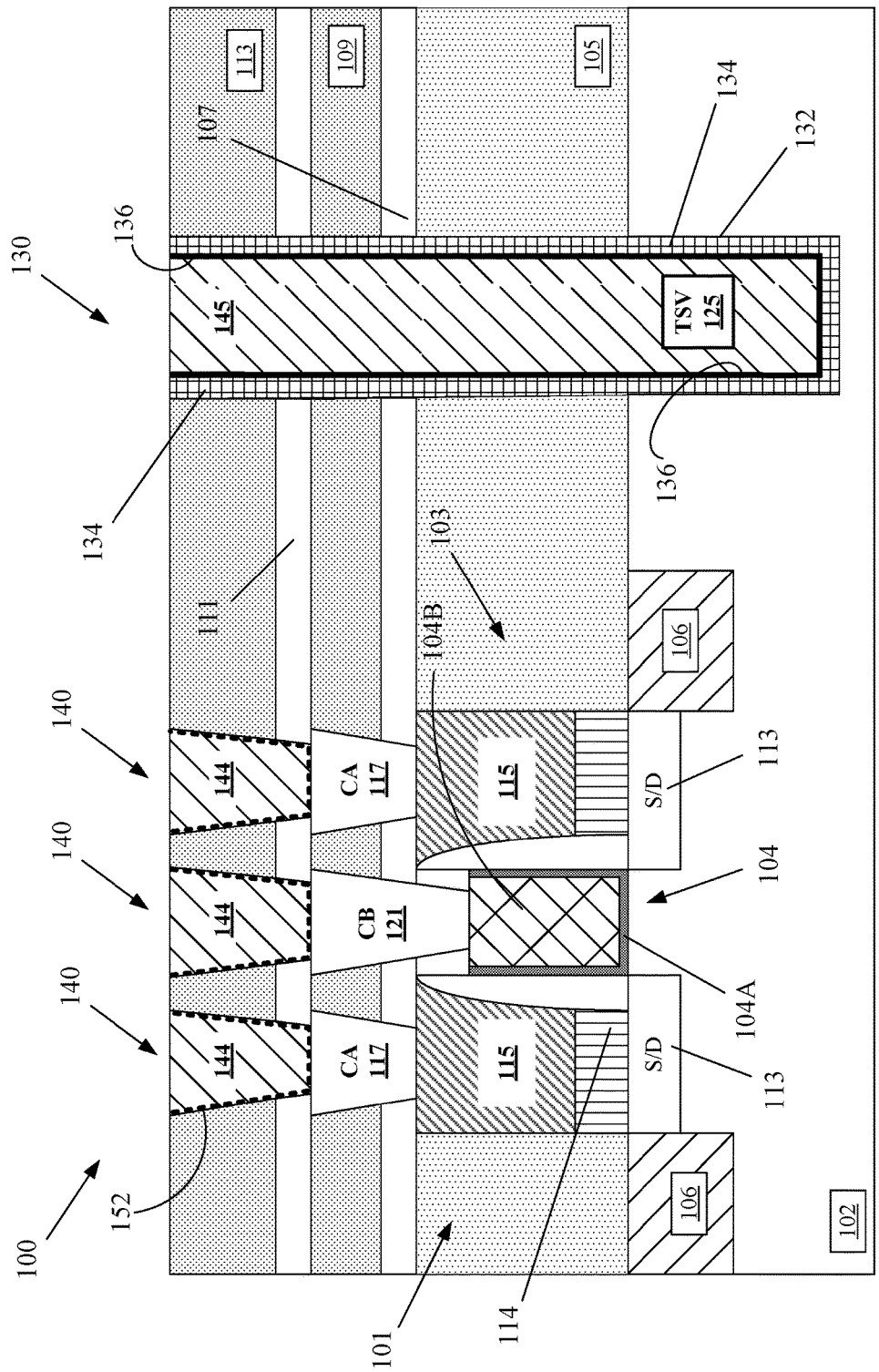

FIG. 5G depicts the product after a common CMP process was performed to form the conductive metallization elements 144 in the openings 140, the TSV 125 in the TSV trench 132 and the TSV contact structure 145 in the opening 130. At this point, additional metallization layers (not shown) comprised of additional metallization elements (not shown) may be formed above the product depicted in FIG. 5G. After completing the formation of the entire metallization system for the product 100, the back side 102X of the substrate 102 may be thinned as described above in connection with FIG. 2I.

The particular embodiments disclosed above are illustrative only, as the subject matter defined by the appended claims may be modified and practiced in different but equivalent manners apparent to those skilled in the art having the benefit of the teachings herein. For example, some or all of the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the claimed subject matter. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:
1. An integrated circuit product, comprising:
a substrate;
an interlayer dielectric (ILD) material positioned above said substrate;
a through-substrate-via (TSV) extending continuously through said substrate and said ILD material, said TSV comprising:
a substrate portion of said TSV positioned in and extending continuously through said substrate, said substrate portion of said TSV having a first lateral width between first opposing outer sidewalls at an interface between said ILD material and said substrate; and
an ILD portion of said TSV positioned in and extending continuously through said ILD material, said ILD portion of said TSV having a second lateral width between second opposing outer sidewalls at said interface between said ILD material and said substrate that is greater than said first lateral width; and
an insulating liner layer selectively positioned between and separating said substrate portion of said TSV and said substrate, wherein said selectively positioned insulating liner layer extends continuously from a top surface of said substrate to a bottom surface of said substrate but does not extend from said substrate to said ILD material, said insulating liner layer having a third lateral width between third opposing outer sidewalls at said interface between said ILD material and said substrate that is substantially the same as said second lateral width.

2. The integrated circuit product of claim 1, wherein said selectively positioned insulating liner layer is not positioned between and separating said ILD portion of said TSV and said ILD material.

3. The integrated circuit product of claim 1, further comprising a metallization system positioned above said ILD material, wherein said ILD portion of said TSV is positioned in and extends continuously through said ILD material and said metallization system.

4. The integrated circuit product of claim 1, further comprising at least one transistor device positioned in and above said substrate, wherein said ILD material laterally surrounds said at least one transistor device.

5. The integrated circuit product of claim 4, further comprising:
at least one device level contact conductively coupled to said at least one transistor device; and at least one conductive metallization element conductively coupled to said at least one device level contact.

6. The integrated circuit product of claim 5, further comprising at least one source/drain contact structure that is conductively coupled to said at least one transistor device.

7. The integrated circuit product of claim 6, wherein said at least one conductive metallization element directly contacts said at least one device level contact, and wherein said at least one device level contact directly contacts said at least one source/drain contact structure.

8. The integrated circuit product of claim 1, wherein sidewalls of said substrate portion of said TSV are laterally offset from sidewalls of said ILD portion of said TSV.

9. The integrated circuit product of claim 8, wherein an offset distance between said sidewalls of said substrate portion of said TSV and said sidewalls of said ILD portion of said TSV is substantially equal to a thickness of said insulating liner layer.

10. The integrated circuit product of claim 1, wherein said TSV comprises:
    a conductive material; and
    a first barrier liner layer, wherein a first portion of said first barrier liner layer is positioned between and separates said insulating liner layer from said conductive material of said substrate portion of said TSV, and wherein a second portion of said first barrier liner layer is positioned between and separates said ILD material from said conductive material of said ILD portion of said TSV.

11. The integrated circuit product of claim 10, wherein said TSV further comprises a second barrier liner layer that is positioned between said first barrier liner layer and said conductive material of said TSV.

12. An integrated circuit product, comprising:
    a substrate;
    an interlayer dielectric (ILD) material positioned above said substrate;
    a metallization system positioned above said ILD material;
    a through-substrate-via (TSV) extending continuously through said substrate, said ILD material, and said metallization system, said TSV comprising:
        a first TSV portion positioned in and extending continuously through said substrate, said first TSV portion having first opposing outer sidewalls and a first lateral width between said first opposing outer sidewalls at an interface between said ILD material and said substrate; and
        a second TSV portion positioned in and extending continuously through said ILD material and said metallization system, said second TSV portion having second opposing outer sidewalls that are laterally offset from said first opposing outer sidewalls of said first TSV portion and a second lateral width between said second opposing outer sidewalls at said interface between said ILD material and said substrate that is greater than said first lateral width; and
    an insulating liner layer selectively positioned between and separating said first TSV portion and said substrate, wherein said selectively positioned insulating liner layer extends continuously from a top surface of said substrate to a bottom surface of said substrate but does not extend from said substrate to said ILD material or to said metallization system and is not positioned between and separates said second TSV portion from said ILD material and said metallization system, said insulating liner layer have third opposing outer sidewalls and a third lateral width between said third opposing outer sidewalls at said interface between said ILD material and said substrate that is substantially the same as said second lateral width.

13. The integrated circuit product of claim 12, wherein an offset distance between said first sidewalls of said first TSV portion and said second sidewalls of said second TSV portion is substantially equal to a thickness of said insulating liner layer.

14. The integrated circuit product of claim 12, wherein said TSV comprises:
    a conductive material; and
    a first barrier liner layer, wherein a first portion of said first barrier liner layer is positioned between and separates said insulating liner layer from said conductive material of said first TSV portion, and wherein a second portion of said first barrier liner layer is positioned between and separates said ILD material and said metallization system from said conductive material of said second TSV portion.

15. The integrated circuit product of claim 14, wherein said TSV further comprises a second barrier liner layer that is positioned between said first barrier liner layer and said conductive material.

16. An integrated circuit product, comprising:
    a substrate;
    an interlayer dielectric (ILD) material positioned above said substrate;
    at least one first layer of insulating material positioned above said ILD material;
    a metallization system positioned above said at least one first layer of insulating material, said metallization system comprising at least a first metallization layer, said first metallization layer comprising at least one second layer of insulating material that is positioned above said at least one first layer of insulating material;
    at least one transistor device positioned in and above said substrate, wherein said ILD material laterally surrounds said at least one transistor device;
    at least one device level contact conductively coupled to said at least one transistor device, wherein said at least one device level contact is positioned in and extends continuously through said at least one first layer of insulating material;
    at least one conductive metallization element conductively coupled to said at least one device level contact, wherein said at least one conductive metallization element is positioned in and extends continuously through said second layer of insulating material of said first metallization layer;
    a through-substrate-via (TSV) extending continuously through said substrate, said ILD material, said first layer of insulating material and said metallization system, said TSV comprising:
        a first TSV portion positioned in and extending continuously through said substrate, said first TSV portion having first opposing outer sidewalls and a first lateral width between said first opposing outer sidewalls at an interface between said ILD material and said substrate; and
        a second TSV portion positioned in and extending continuously through said ILD material, said first layer of insulating material and said metallization system, said second TSV portion having second opposing outer sidewalls that are laterally offset from said first opposing outer sidewalls of said first TSV portion and a second lateral width between said second opposing outer sidewalls at said interface between said ILD material and said substrate that is greater than said first lateral width; and an insulating liner layer selectively positioned between and separating said first TSV portion and said substrate, wherein said selectively positioned insulating liner layer extends continuously from a top surface of said substrate to a bottom surface of said substrate but does not extend from said substrate to said ILD material, to said at least one first layer of insulating material, or to said metallization system, said insulating liner layer having third opposing outer sidewalls and a third lateral width between said third opposing outer sidewalls at said interface between said ILD material and said substrate that is substantially the same as said second lateral width.

17. The integrated circuit product of claim 16, wherein said conductive metallization element is one of a conductive line and a conductive via.

18. The integrated circuit product of claim 16, wherein said at least one conductive metallization element directly contacts said at least one device level contact and wherein said at least one device level contact directly contacts said at least one transistor device.

19. The integrated circuit product of claim 16, wherein said selectively positioned insulating liner layer is not positioned between and separating said second TSV portion and said metallization system, is not positioned between and separating said second TSV portion and said at least one first layer of insulating material, and is not positioned between and separating said second TSV portion and said ILD material.

20. The integrated circuit product of claim 16, wherein said ILD portion of said TSV extending through said at least one first layer of insulating material has a fourth lateral width between said second opposing outer sidewalls at an interface between said at least one first layer of insulating material and said at least one second layer of insulating material and said ILD portion of said TSV extending through said at least one second layer of insulating material has a fifth lateral width between said second opposing outer sidewalls at said interface between said at least one first layer of insulating material and said at least one second layer of insulating material, said fourth lateral width being substantially the same as said fifth lateral width.

* * * * *